(12) United States Patent
Yano et al.

(10) Patent No.: US 12,323,070 B2
(45) Date of Patent: Jun. 3, 2025

(54) POWER CONVERSION DEVICE

(71) Applicant: FUJI ELECTRIC CO., LTD., Kawasaki (JP)

(72) Inventors: Yuki Yano, Suzuka (JP); Hiroyuki Kuwahara, Suzuka (JP); Yoshio Mori, Suzuka (JP); Masamitsu Takizawa, Suzuka (JP); Jun Kanda, Kobe (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 66 days.

(21) Appl. No.: 18/321,293

(22) Filed: May 22, 2023

(65) Prior Publication Data

US 2023/0396181 A1 Dec. 7, 2023

(30) Foreign Application Priority Data

Jun. 3, 2022 (JP) ................................. 2022-090896

(51) Int. Cl.
| | | |
|---|---|---|
| *H02M 5/458* | (2006.01) | |
| *B61C 17/00* | (2006.01) | |
| *H02M 7/00* | (2006.01) | |
| *H02M 7/483* | (2007.01) | |
| *H02M 7/539* | (2006.01) | |
| *H01L 25/16* | (2023.01) | |
| *H10D 1/68* | (2025.01) | |

(52) U.S. Cl.
CPC ........... *H02M 5/4585* (2013.01); *B61C 17/00* (2013.01); *H02M 7/003* (2013.01); *H02M 7/483* (2013.01); *H02M 7/539* (2013.01); *H01L 25/16* (2013.01); *H10D 1/68* (2025.01)

(58) Field of Classification Search
None
See application file for complete search history.

(56) References Cited

U.S. PATENT DOCUMENTS

| | | | |
|---|---|---|---|
| 2017/0194873 A1* | 7/2017 | Takahashi | H02M 1/327 |
| 2021/0028714 A1* | 1/2021 | Matsui | H02M 5/293 |

FOREIGN PATENT DOCUMENTS

| | | |
|---|---|---|
| JP | 2016-213945 A | 12/2016 |
| JP | 2016-213946 A | 12/2016 |
| JP | 2020-022263 A | 2/2020 |
| JP | 2020-150623 A | 9/2020 |
| JP | 2021-022972 A | 2/2021 |
| JP | 6858244 B2 | 4/2021 |
| JP | 2021-141638 A | 9/2021 |

* cited by examiner

*Primary Examiner* — Jared Fureman
*Assistant Examiner* — Aqeel H Bukhari
(74) *Attorney, Agent, or Firm* — HAUPTMAN HAM, LLP

(57) ABSTRACT

A power conversion device includes a power converter including a semiconductor module, to convert input power and output the converted power, and a capacitor electrically connected to the semiconductor module. The capacitor includes a capacitor-side terminal surface on which a capacitor-side terminal is arranged, and the capacitor-side terminal surface faces a module-side terminal surface of the semiconductor module.

12 Claims, 11 Drawing Sheets

POWER CONVERSION DEVICE

CROSS-REFERENCE TO RELATED APPLICATION

The present application claims priority of Japanese Patent Application No. 2022-090896 filed Jun. 3, 2022, the disclosure of which is hereby incorporated by reference.

BACKGROUND OF THE INVENTION

Field of the Invention

The present invention relates to a power conversion device, and more particularly, it relates to a power conversion device including a semiconductor module.

Description of the Background Art

A power conversion device including a semiconductor module is known in general. Such a power conversion device is disclosed in Japanese Patent No. 6858244, for example.

A power conversion device described in Japanese Patent No. 6858244 includes a plurality of semiconductor modules and a plurality of capacitors. In this power conversion device, three semiconductor modules constitute a clamp diode type three-level circuit. The three semiconductor modules are arranged in a row along a cooling surface. Four capacitors face the three semiconductor modules arranged side by side. The four capacitors are arranged two by two along a direction in which the three semiconductor modules are aligned. Each of the four capacitors includes a terminal arranged on an outer side surface in the direction in which the three semiconductor modules are aligned. A U-shaped bus bar is connected to the four capacitors aligned two by two so as to cover the capacitors from the outside.

In the power conversion device described in Japanese Patent No. 6858244, the terminals of the capacitors are arranged on the outer side surface in the direction in which the three semiconductor modules are aligned. Therefore, when a sensor such as a voltage sensor or a temperature sensor, or a device including a substrate such as a gate drive unit is arranged separately from the semiconductor modules and the capacitors, it is necessary to arrange the device while considering insulation distances from the terminals arranged outside the capacitors. Thus, the device arranged separately from the semiconductor modules and the capacitors cannot be arranged close to the side surfaces of the capacitors, and thus the size of the device is disadvantageously increased.

SUMMARY OF THE INVENTION

The present invention has been proposed in order to solve the aforementioned problem, and an object of the present invention is to provide a power conversion device capable of reducing or preventing an increase in its size.

In order to attain the aforementioned object, a power conversion device according to an aspect of the present invention includes a power converter including a semiconductor module having a switching element to convert input power and output the converted power, and a capacitor electrically connected to the semiconductor module of the power converter. The semiconductor module includes a module-side terminal surface on which a module-side terminal of the semiconductor module is arranged, the capacitor includes a capacitor-side terminal surface on which a capacitor-side terminal of the capacitor is arranged, and the capacitor-side terminal surface faces the module-side terminal surface of the semiconductor module.

In the power conversion device according to the aspect of the present invention, as described above, the semiconductor module includes the module-side terminal surface on which the module-side terminal of the semiconductor module is arranged. The capacitor includes the capacitor-side terminal surface on which the capacitor-side terminal of the capacitor is arranged, and the capacitor-side terminal surface faces the module-side terminal surface of the semiconductor module. Accordingly, the capacitor-side terminal surface and the module-side terminal surface face each other, and thus exposure of the capacitor-side terminal on a side surface of the capacitor other than the semiconductor module side can be reduced or prevented. Therefore, a device arranged separately from the capacitor and the semiconductor module can be arranged close to the capacitor without considering an insulation distance. Consequently, an increase in the size of the power conversion device can be reduced or prevented.

The power conversion device according to this aspect preferably further includes a capacitor-side conductor connected to the capacitor-side terminal and arranged along the capacitor-side terminal surface, and a module-side conductor connected to the module-side terminal and arranged along the module-side terminal surface. The capacitor-side conductor and the module-side conductor are preferably connected to each other on an end side of the capacitor-side terminal surface in a direction along the capacitor-side terminal surface while the capacitor-side terminal surface and the module-side terminal surface face each other. Accordingly, the capacitor-side conductor and the module-side conductor are connected to each other on the end side of the capacitor-side terminal surface, and thus the capacitor-side conductor and the module-side conductor can be connected to each other from the outer sides of the capacitor and the semiconductor module on the end side of the capacitor-side terminal surface without inserting a tool or the like between the capacitor and the semiconductor module. Therefore, even when the capacitor-side terminal surface and the module-side terminal surface face each other, it is not necessary to provide a gap to insert a tool or the like between the capacitor and the semiconductor module, and thus the capacitor and the semiconductor module can be arranged close to each other. Consequently, a distance between the capacitor and the semiconductor module can be reduced, and thus an increase in the size of the power conversion device can be further reduced or prevented.

In this case, the power conversion device preferably further includes a relay conductor to connect the capacitor-side conductor and the module-side conductor to each other on the end side of the capacitor-side terminal surface in the direction along the capacitor-side terminal surface. Accordingly, the relay conductor is provided separately from the capacitor-side conductor and the module-side conductor, and thus the capacitor-side conductor and the module-side conductor can be connected to each other by the relay conductor without changing the shapes of the capacitor-side conductor and the module-side conductor facing each other. Therefore, the capacitor-side conductor and the module-side conductor can be connected to each other by the relay conductor while the complexity of the shapes of the capacitor-side conductor and the module-side conductor is reduced or prevented.

In the power conversion device including the relay conductor to connect the capacitor-side conductor and the module-side conductor to each other, the capacitor-side conductor preferably includes a capacitor-side mount bent in a direction along a surface of the capacitor adjacent to the capacitor-side terminal surface from the direction along the capacitor-side terminal surface, the relay conductor preferably has an L-shape extending along the module-side terminal surface and along a direction facing the module-side terminal surface, and includes a relay conductor-side mount connected to the capacitor-side mount in a portion extending along the direction facing the module-side terminal surface, and the relay conductor-side mount preferably includes a notched hole opening in a direction in which the capacitor-side terminal surface and the module-side terminal surface face each other. Accordingly, the relay conductor-side mount of the relay conductor having an L-shape includes the notched hole opening in the direction in which the capacitor-side terminal surface and the module-side terminal surface face each other, and thus even when a manufacturing tolerance occurs in the direction in which the capacitor-side terminal surface and the module-side terminal surface face each other, the capacitor-side conductor and the relay conductor can be easily connected to each other by connecting the notched hole to the capacitor-side mount. Therefore, even when a manufacturing tolerance occurs in the direction in which the capacitor-side terminal surface and the module-side terminal surface face each other, the assembly operation can be easily performed.

In the power conversion device according to this aspect, the power converter preferably includes at least one of a converter to convert input AC power into DC power or an inverter to convert input DC power into AC power and output the AC power. The semiconductor module preferably includes a plurality of aligned semiconductor modules, and the plurality of semiconductor modules preferably includes an input/output module including an AC terminal to which an AC conductor to which or from which AC power is input or output is connected. The input/output module is preferably arranged at an end on one side in a direction in which the plurality of semiconductor modules is aligned, and the AC terminal is preferably arranged on the one side in the input/output module. Accordingly, the AC terminal is arranged on one side in the plurality of aligned semiconductor modules, and thus an increase in the length of the AC conductor connected to the input/output module can be reduced or prevented. Therefore, an increase in the weight of the entire power conversion device can be reduced or prevented.

The power conversion device according to this aspect preferably further includes a module-side conductor connected to the module-side terminal and arranged along the module-side terminal surface. The power converter preferably includes at least one of a three-level inverter to which three levels of potential including an upper potential, an intermediate potential, and a lower potential are input or a three-level converter from which three levels of potential including an upper potential, an intermediate potential, and a lower potential are output, the module-side conductor preferably includes an upper conductor to which an upper potential is applied, an intermediate conductor to which an intermediate potential is applied, and a lower conductor to which a lower potential is applied, and the capacitor-side terminal surface of the capacitor preferably faces the upper conductor, the intermediate conductor, and the lower conductor. Accordingly, even when the power converter includes at least one of the three-level inverter or the three-level converter, the capacitor-side terminal surface faces the upper conductor, the intermediate conductor, and the lower conductor, and thus exposure of the capacitor-side terminal and the upper, intermediate, and lower conductors on the side surface of the capacitor other than the semiconductor module side can be reduced or prevented. Therefore, even when the power converter includes at least one of the three-level inverter or the three-level converter, a device arranged separately from the capacitor and the semiconductor module can be arranged close to the capacitor, and thus an increase in the size of the power conversion device can be reduced or prevented.

In this case, the semiconductor module preferably includes a first module including one switching element and one clamp diode and connected to the upper conductor and the intermediate conductor, a second module including one switching element and one clamp diode and connected to the intermediate conductor and the lower conductor, and a third module including two switching elements and connected to the first module and the second module, and the module-side conductor preferably includes a first connection conductor to connect the first module to the third module, and a second connection conductor to connect the second module to the third module. The upper conductor, the intermediate conductor, and the lower conductor are preferably laminated while being insulated from each other to form a first laminated conductor, and the first connection conductor and the second connection conductor are preferably laminated separately from the first laminated conductor while being insulated from each other to form a second laminated conductor. When each of a plurality of laminated conductors is connected, it is necessary to provide a hole in the other conductor in order to arrange a fastening member such as a screw at a connecting portion of one of the plurality of conductors. In consideration of this point, in the present invention, the upper conductor, the intermediate conductor, and the lower conductor are laminated while being insulated from each other to form the first laminated conductor, and the first connection conductor and the second connection conductor are laminated separately from the first laminated conductor while being insulated from each other to form the second laminated conductor. Accordingly, the first laminated conductor formed by the upper, intermediate, and lower conductors and the second laminated conductor formed by the first and second connection conductors can be separately connected to the semiconductor module. Therefore, as compared with a case in which the upper, intermediate, and lower conductors and the first and second connection conductors are collectively formed as one laminated conductor, the number of holes for avoiding the connecting portion can be reduced, and thus a decrease in the cross-sectional areas of the conductors can be reduced or prevented. Consequently, in the upper, intermediate, and lower conductors and the first and second connection conductors, local heat generation due to current concentration can be reduced or prevented, and an increase in inductance can be reduced or prevented.

The power conversion device according to this aspect preferably further includes a module-side conductor connected to the module-side terminal and arranged along the module-side terminal surface, and the power converter preferably includes at least one of a two-level inverter to which two levels of potential including an upper potential and a lower potential are input or a two-level converter from which two levels of potential including an upper potential and a lower potential are output. The module-side conductor preferably includes an upper conductor to which an upper potential is applied and a lower conductor to which a lower potential is applied, and the capacitor-side terminal surface of the capacitor preferably faces the upper conductor and the lower conductor. Accordingly, even when the power converter includes at least one of the two-level inverter or the two-level converter, the capacitor-side terminal surface faces the upper and lower conductors, and thus exposure of the capacitor-side terminal and the upper and lower conductors on the side surface of the capacitor other than the semiconductor module side can be reduced or prevented. Therefore, even when the power converter includes at least one of the two-level inverter or the two-level converter, a device arranged separately from the capacitor and the semiconductor module can be arranged close to the capacitor, and thus an increase in the size of the power conversion device can be reduced or prevented.

In the power conversion device according to this aspect, the power converter and the capacitor are preferably mounted on a railroad vehicle. Accordingly, even when the power converter and the capacitor are mounted on the railroad vehicle, a device separate from the semiconductor module and the capacitor can be arranged close to the capacitor, and thus an increase in the size of the power conversion device mounted on the railroad vehicle can be effectively reduced or prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

Figure 1:
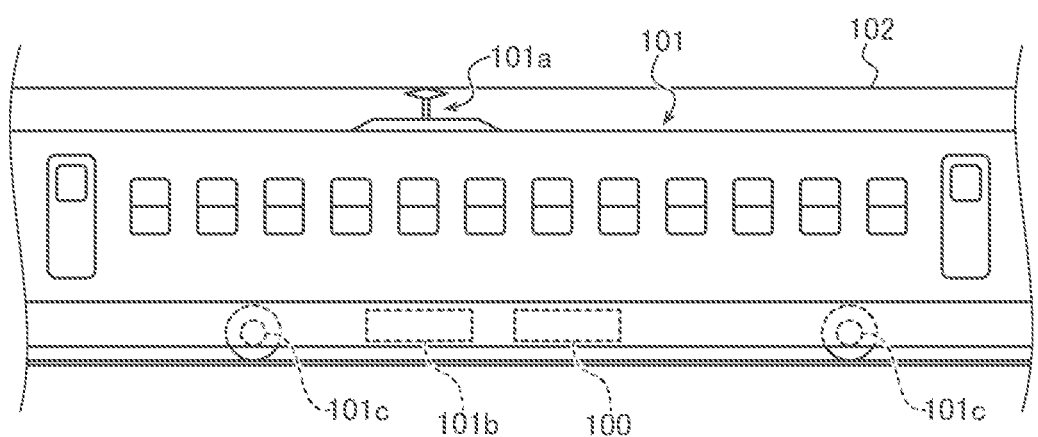
FIG. 1 is a schematic view showing a railroad vehicle equipped with a power conversion device according to a first embodiment.
Figure 2:
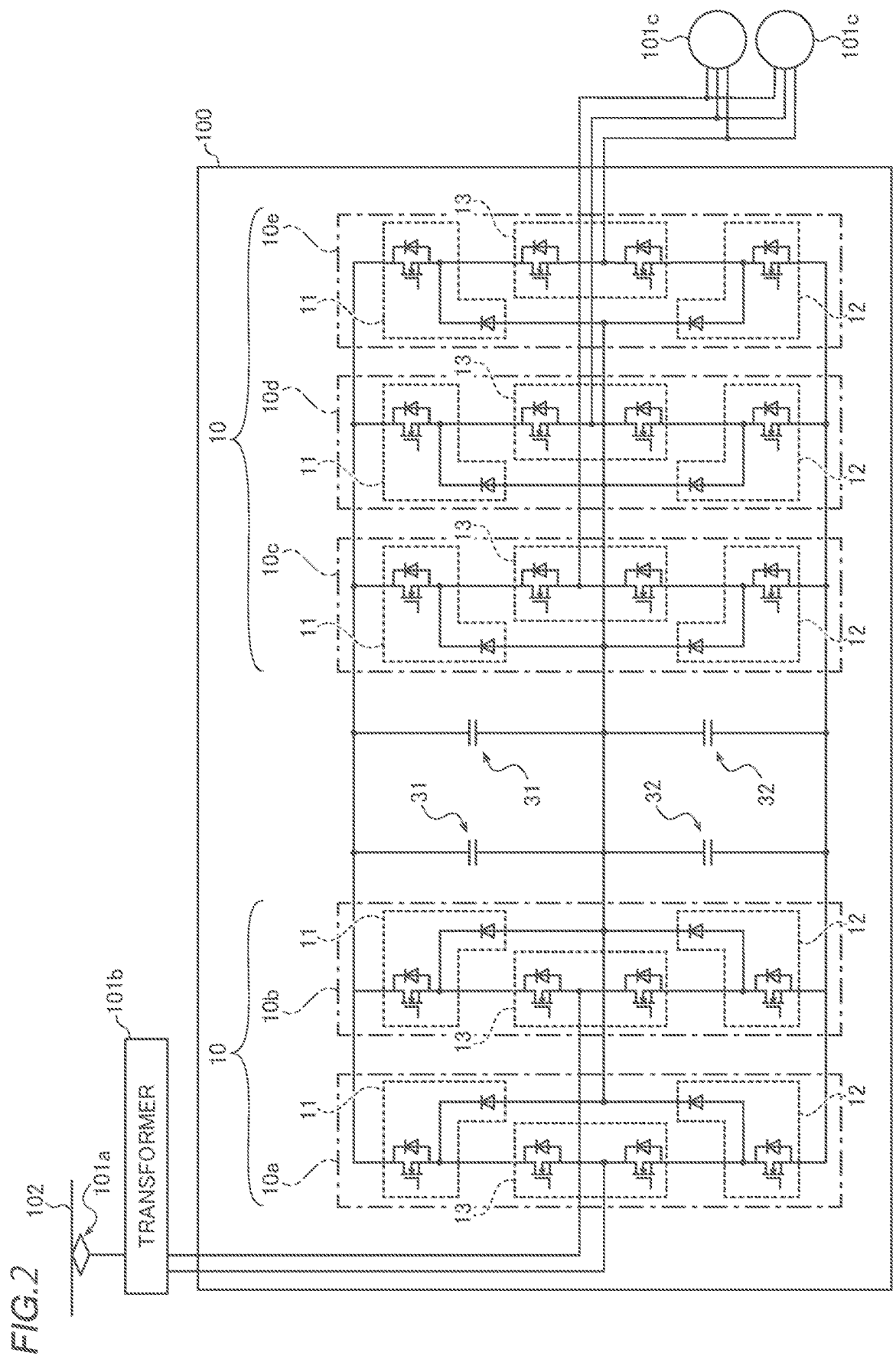
FIG. 2 is a circuit diagram showing an equivalent circuit of the power conversion device according to the first embodiment.

The configuration of a power conversion device 100 according to a first embodiment is now described with reference to FIGS. 1 to 10. The power conversion device 100 is mounted on a railroad vehicle 101.
Configuration of Railroad Vehicle As shown in FIGS. 1 and 2, the railroad vehicle 101 runs on rails with single-phase AC power supplied from an overhead wire 102 as an AC power supply. The railroad vehicle 101 includes a pantograph 101a, a transformer 101b, motors 101c, and the power conversion device 100. The pantograph 101a receives (collects) power supplied to the overhead wire 102. The transformer 101b transforms the AC power received by the pantograph 101a and outputs the transformed AC power. The motors 101c include induction motors that rotate drive wheels with the AC power supplied from the power conversion device 100. The power conversion device 100 converts the power from the overhead wire 102 by the switching operations of switching elements Q1 to Q4 (see FIG. 3) to control rotation of the motors 101c when the railroad vehicle 101 is running.
Overall Configuration of Power Conversion Device As shown in FIG. 2, the power conversion device 100 includes a power converter 10 and capacitors 31 and 32. In the power conversion device 100, the power converter 10 and the capacitors 31 and 32 mounted on the railroad vehicle 101 constitute a three-level power conversion circuit for driving the motors 101c. The power converter 10 converts input power and outputs the converted power. The power converter 10 includes a converter 10a, a converter 10b, an inverter 10c, an inverter 10d, and an inverter 10e. The two converters 10a and 10b convert input single-phase AC power into DC power. The inverters 10c to 10e convert the DC power input from the converters 10a and 10b into three-phase AC power and output the three-phase AC power to the motors 101c. The converters 10a and 10b are examples of a "converter" or a "three-level converter" in the claims. The inverter 10c, the inverter 10d, and the inverter 10e are examples of an "inverter" or a "three-level inverter" in the claims.

The converter 10a receives U-phase AC power of single-phase AC power having a U-phase and a V-phase. The converter 10b receives V-phase AC power of the single-phase AC power. The converters 10a and 10b output DC power having three levels of potential including an upper potential, an intermediate potential, and a lower potential. The inverters 10c to 10e receive the DC power having three levels of potential including an upper potential, an intermediate potential, and a lower potential, which is output from the converters 10a and 10b. The inverter 10c outputs U-phase AC power of three-phase AC power having a U-phase, a V-phase, and a W-phase. The inverter 10d outputs V-phase AC power of three-phase AC power having a U-phase, a V-phase, and a W-phase. The inverter 10e outputs W-phase AC power of three-phase AC power having a U-phase, a V-phase, and a W-phase.

The power converter 10 includes modules 11, modules 12, and modules 13. Specifically, each of the converters 10a and 10b and the inverters 10c to 10e includes a module 11, a module 12, and a module 13. The module 11 is an example of a "semiconductor module" or a "first module" in the claims. The module 12 is an example of a "semiconductor module" or a "second module" in the claims. The module 13 is an example of a "semiconductor module", a "third module", or an "input/output module" in the claims.

Figure 3:
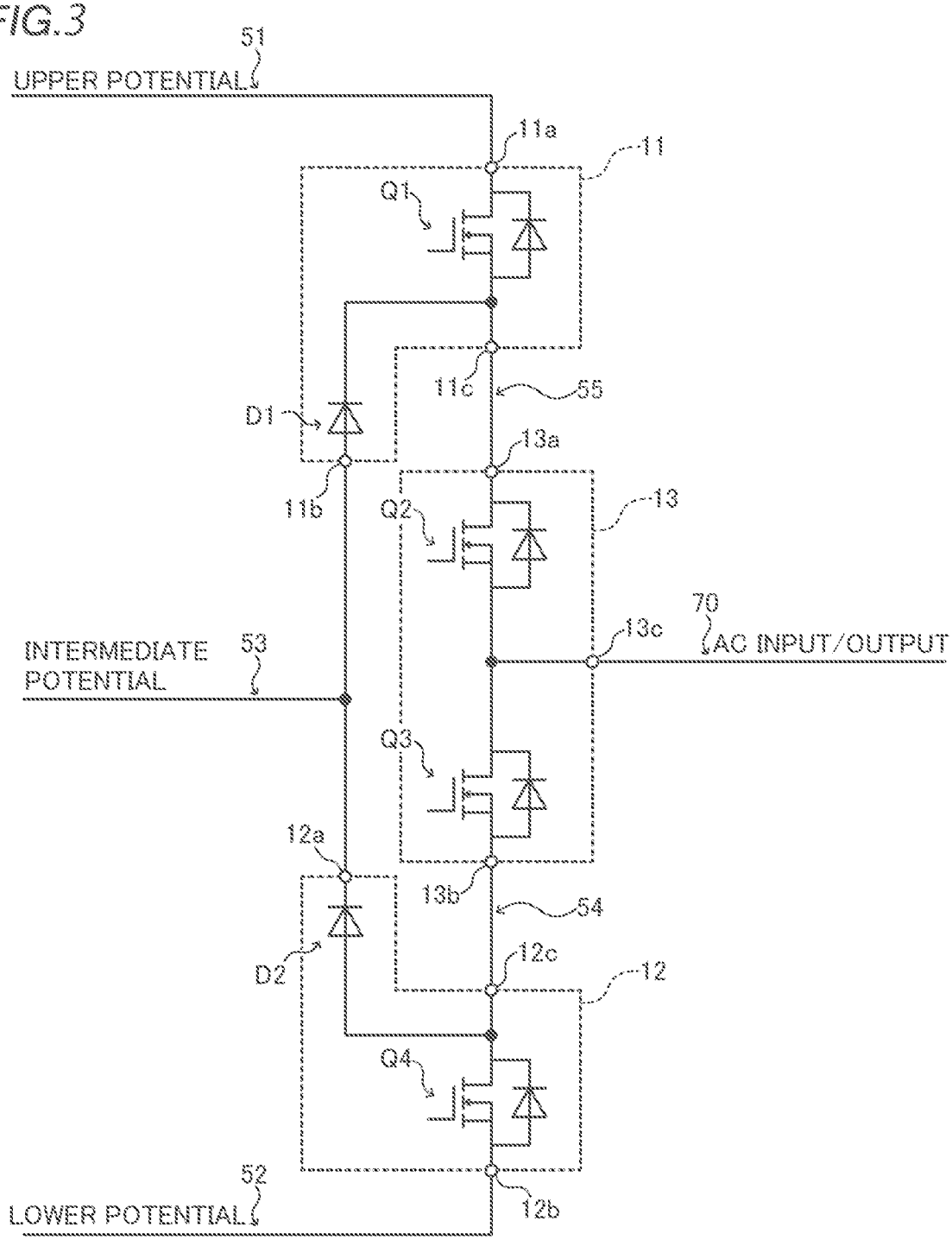
FIG. 3 is a circuit diagram for illustrating the connection of three modules.

As shown in FIG. 3, the module 11 includes one switching element Q1 and one clamp diode D1. The module 12 includes one switching element Q4 and a clamp diode D2. The module 13 includes two switching elements Q2 and Q3. The switching elements Q1 to Q4 are metal-oxide semiconductor field-effect transistors (MOSFETs), for example. In FIG. 3, diodes connected in parallel to the switching elements Q1 to Q4 represent parasitic diodes (body diodes) of the MOSFETs. A diode element may be connected in parallel to each of the switching elements Q1 to Q4 instead of the parasitic diodes.

The module 11 is provided on the positive electrode side. In the module 11, the source side of the switching element Q1 is connected to the cathode side of the clamp diode D1. The module 11 includes terminals 11a, 11b, and 11c. The terminal 11a is connected to the drain side of the switching element Q1. The terminal 11b is connected to the anode side of the clamp diode D1. The terminal 11c is connected between the switching element Q1 and the clamp diode D1. That is, the terminal 11c is connected to the source side of the switching element Q1 and the cathode side of the clamp diode D1. The terminals 11a, 11b, and 11c are examples of a "module-side terminal" in the claims.

The module 12 is provided on the negative electrode side. In the module 12, the drain side of the switching element Q4 is connected to the anode side of the clamp diode D2. The module 12 includes terminals 12a, 12b, and 12c. The terminal 12a is connected to the cathode side of the clamp diode D2. The terminal 12b is connected to the source side of the switching element Q4. The terminal 12c is connected between the clamp diode D2 and the switching element Q2. That is, the terminal 12c is connected to the anode side of the clamp diode D2 and the drain side of the switching element Q4. The terminals 12a, 12b, and 12c are examples of a "module-side terminal" in the claims.

The module 13 is connected to the module 11 and the module 12. In the module 13, the source side of the switching element Q2 is connected to the drain side of the switching element Q3. The module 13 includes terminals 13a, 13b, and 13c. The terminal 13a is connected to the drain side of the switching element Q2. The terminal 13b is connected to the source side of the switching element Q3. The terminal 13c is connected between the switching element Q2 and the switching element Q3. That is, the terminal 13c is connected to the source side of the switching element Q2 and the drain side of the switching element Q3. The terminals 13a, 13b, and 13c are examples of a "module-side terminal" in the claims. The terminal 13c is an example of an "AC terminal" in the claims.

In the modules 11 to 13, the switching elements Q1 to Q4 are connected in series to each other from the upper potential side (positive electrode side) to the lower potential side (negative electrode side). That is, a conductor 51, which is an upper potential conductor (upper conductor), is connected to the drain side (terminal 11a) of the switching element Q1. A conductor 52, which is a lower potential conductor (lower conductor), is connected to the source side (terminal 12b) of the switching element Q4. The source side (terminal 11c) of the switching element Q1 and the drain side (terminal 13a) of the switching element Q2 are connected to each other via a conductor 55. The source side (terminal 13b) of the switching element Q3 and the drain side (terminal 12c) of the switching element Q4 are connected to each other via a conductor 54. A conductor 53, which is an intermediate potential conductor (intermediate conductor), is connected to the anode side of the clamp diode D1 and the cathode side of the clamp diode D2. An AC conductor 70, which is either an input conductor or an output conductor for AC power, is connected to the terminal 13c of the module 13. That is, when the modules 11 to 13 are included in the converters 10a and 10b, AC power is input to the terminal 13c. When the modules 11 to 13 are included in the inverters 10c to 10e, AC power is output to the terminal 13c. The conductors 51 to 55 and the AC conductor 70 are described below in detail.

Figure 4:
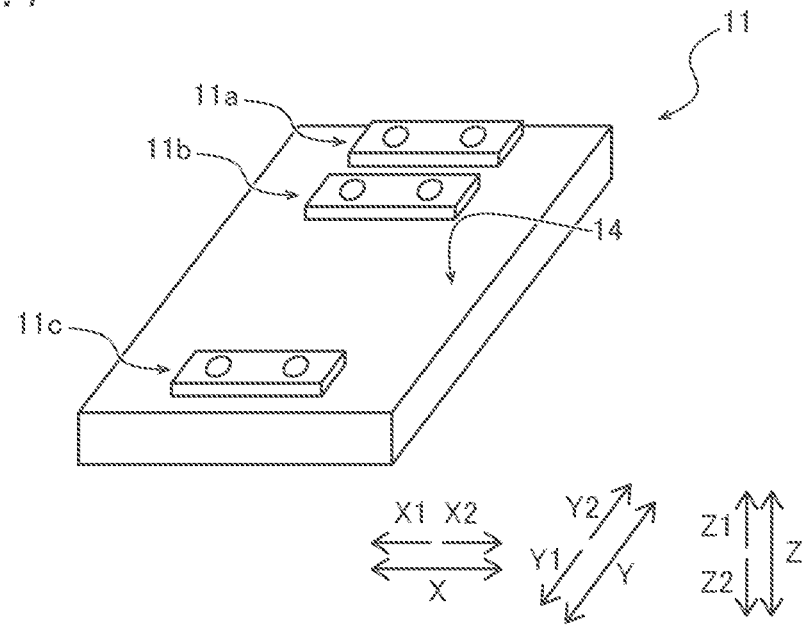
FIG. 4 is a perspective view for illustrating terminals of a module.

As shown in FIG. 4, the module 11 has a terminal surface 14. The module 11 has a flat rectangular parallelepiped shape. The terminals 11a, 11b, and 11c are aligned in this order along a Y1 direction on the terminal surface 14. The modules 12 and 13 also have terminal surfaces 14, similarly to the module 11. In the modules 12 and 13, the terminals 12a, 12b, and 12c and the terminals 13a, 13b, and 13c are aligned in this order on the terminal surfaces 14, respectively, similarly to the module 11. Although FIG. 4 shows the terminal surface 14 of the module 11 and the terminals 11a to 11c, the terminal surface 14 of the module 12 and the terminals 12a to 12c and the terminal surface 14 of the module 13 and the terminals 13a to 13c are the same or similar as the terminal surface 14 of the module 11 and the terminals 11a to 11c, and thus illustration thereof is omitted. The terminal surfaces 14 are examples of a "module-side terminal surface" in the claims.

Figure 5:
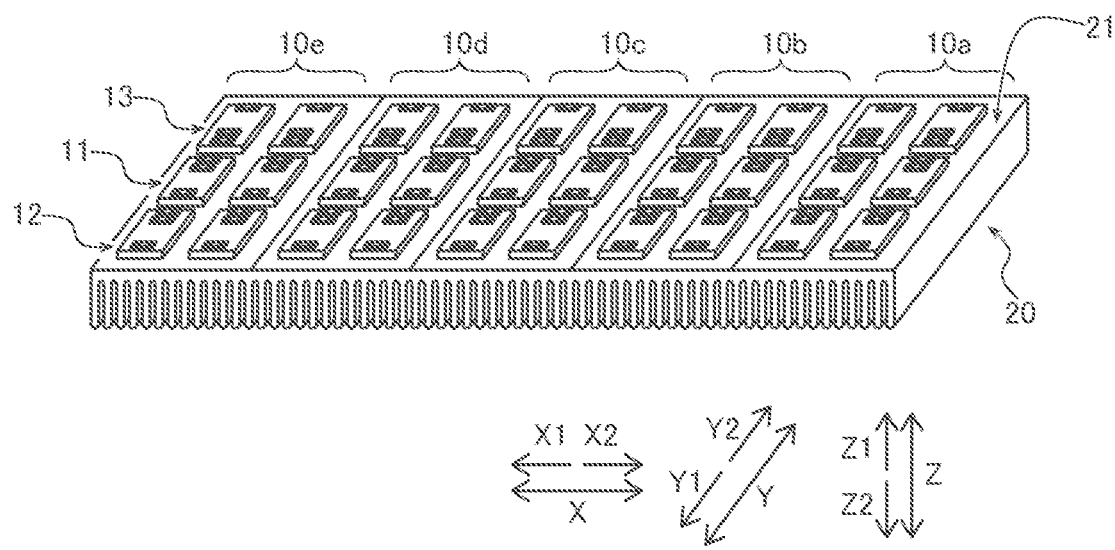
FIG. 5 is a perspective view for illustrating the arrangement of modules on a cooling surface.

As shown in FIG. 5, the modules 11 to 13 are aligned in each of the converters 10a and 10b and the inverters 10c to 10e. The modules 12, 11, and 13 are aligned in this order along a Y2 direction. The converter 10a, the converter 10b, the inverter 10c, the inverter 10d, and the inverter 10e are aligned in this order along an X1 direction. In the power converter 10, two converters 10a and two converters 10b are provided. That is, the converters 10a and the converters 10b each include two modules 11, two modules 12, and two modules 13. The two converters 10a are connected in parallel to each other. The two converters 10b are connected in parallel to each other. In the power converter 10, two inverters 10c, two inverters 10d, and two inverters 10e are similarly provided in parallel. Therefore, the converters 10a and 10b and the inverters 10c to 10e each include two modules 11, two modules 12, and two modules 13. In a circuit diagram of FIG. 2, one converter 10a, one converter 10b, one inverter 10c, one inverter 10d, and one inverter 10e are shown, and portions provided in parallel are omitted.

The power conversion device 100 includes a cooling body 20. The cooling body 20 cools each of a plurality of modules 11 to 13. The cooling body 20 has a cooling surface 21. The plurality of modules 11 to 13 is aligned on the cooling surface 21. The cooling body 20 has the cooling surface 21 along an X-Y plane on the Z1 direction side. Furthermore, the cooling body 20 includes radiation fins on the side (Z2 direction side) opposite to the cooling surface 21. The cooling body 20 cools the modules 11 to 13 by exchanging heat with the modules 11 to 13 arranged on the cooling surface 21 on the Z1 direction side. Surfaces of the modules 11 to 13 on the Z2 direction side contact the cooling surface 21. The terminal surfaces 14 of the modules 11 to 13 are provided on the Z1 direction side opposite to the surfaces contacting the cooling surface 21.

Figure 6:
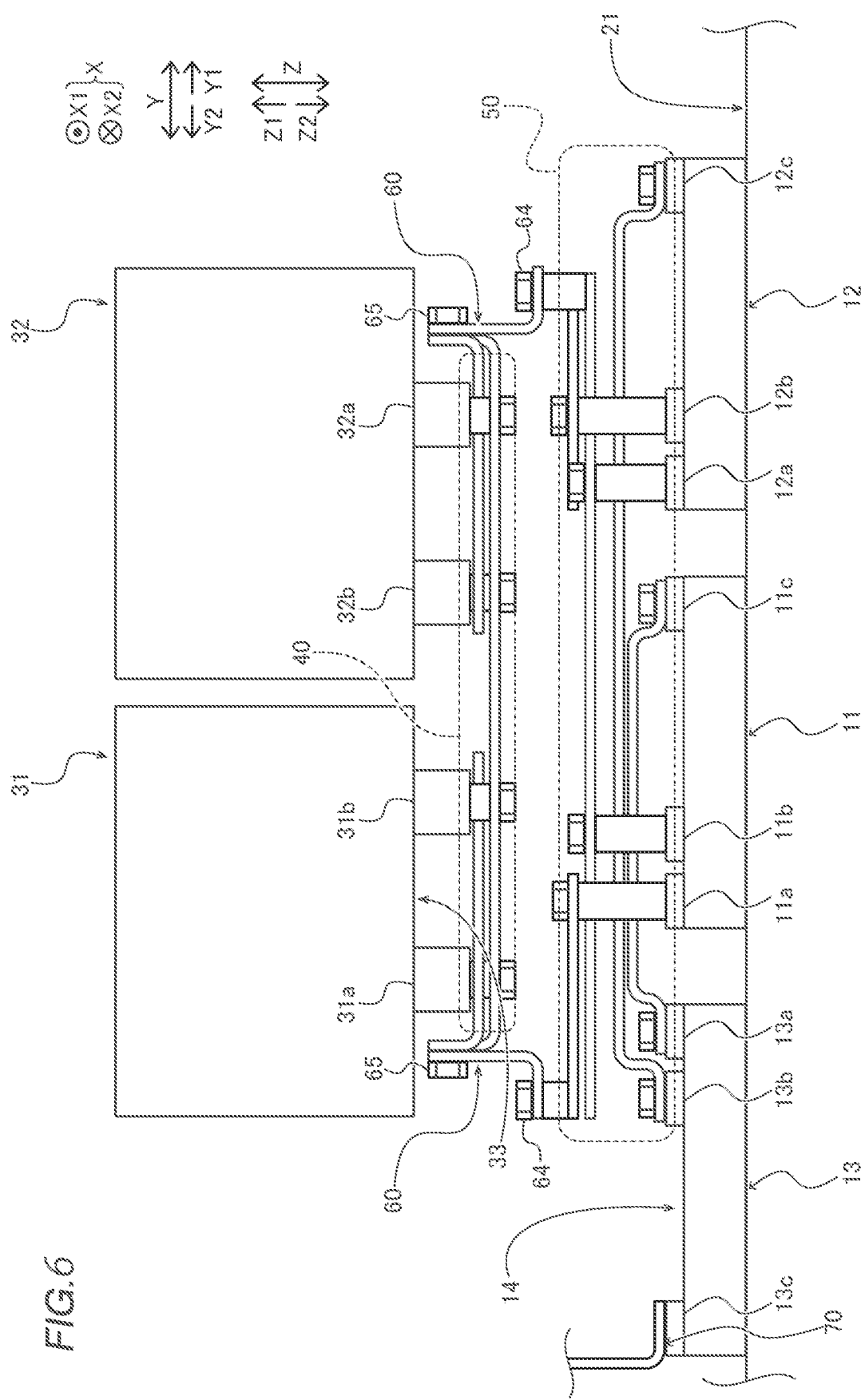
FIG. 6 is a schematic view for illustrating the arrangement of capacitors and the modules.

As shown in FIGS. 2 and 6, the power conversion device 100 includes the capacitors 31 and 32. The capacitors 31 and 32 are electrically connected to the power converter 10. The capacitors 31 and 32 smooth DC power output from the converters 10a and 10b and input to the inverters 10c to 10e, for example. The capacitors 31 and 32 are connected in series to each other. The capacitors 31 each include positive electrode-side terminals 31a and negative electrode-side terminals 31b. The capacitors 32 each include positive electrode-side terminals 32a and negative electrode-side terminals 32b. The terminals 31a of the capacitor 31 are electrically connected to the terminals 11a of the modules 11. The terminals 31b of the capacitor 31 are connected to the terminals 32a of the capacitor 32. The terminals 32b of the capacitor 32 are connected to the terminals 12b of the modules 12. The terminals 31a of the capacitor 31 are connected to a conductor 41 (see FIG. 7) that is an upper conductor (upper potential conductor). The terminals 32b of the capacitor 32 are connected to a conductor 42 (see FIG. 7) that is a lower conductor (lower potential conductor). The terminals 31b of the capacitor 31 and the terminals 32a of the capacitor 32 are connected to a conductor 43 (see FIG. 7) that is an intermediate conductor (intermediate potential conductor). The terminals 31a, 31b, 32a, and 32b are examples of a "capacitor-side terminal" in the claims.

Figure 7:
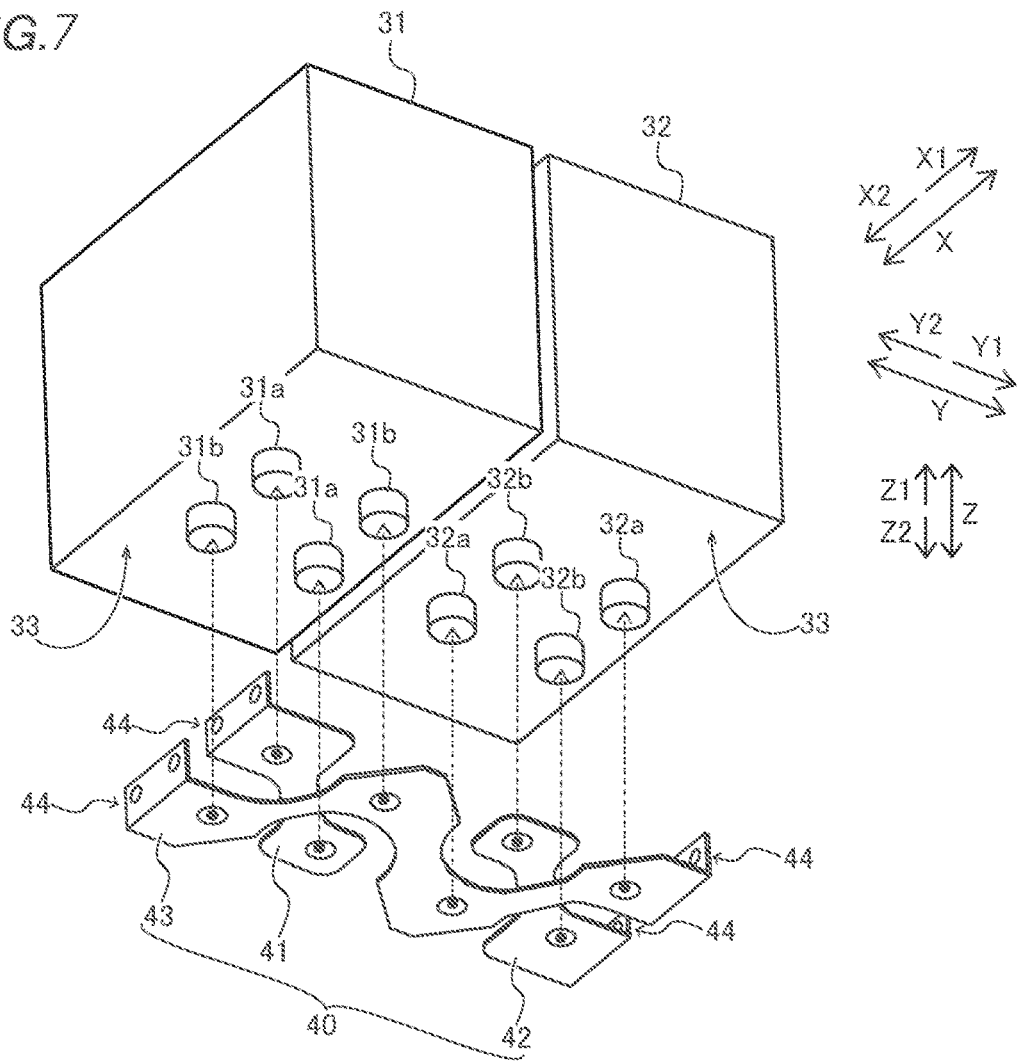
FIG. 7 is a perspective view for illustrating the configuration of the capacitors.

As shown in FIG. 7, each of the capacitors 31 and 32 has a terminal surface 33. Each of the capacitors 31 and 32 has a substantially rectangular parallelepiped shape. In the capacitors 31 and 32, the terminal surface 33 is arranged on the Z2 direction side. Two terminals 31a and two terminals 31b are arranged on the terminal surface 33 of the capacitor 31. The terminals 31a and the terminals 31b are arranged in a staggered manner along an X direction on the terminal surface 33. Similarly, on the terminal surface 33 of the capacitor 32, two terminals 32a and two terminals 32b are arranged in a staggered manner along the X direction. That is, the terminals of the capacitors 31 and 32 having the same potential are arranged in a staggered manner. The terminal surface 33 is an example of a "capacitor-side terminal surface" in the claims.

Figure 8:
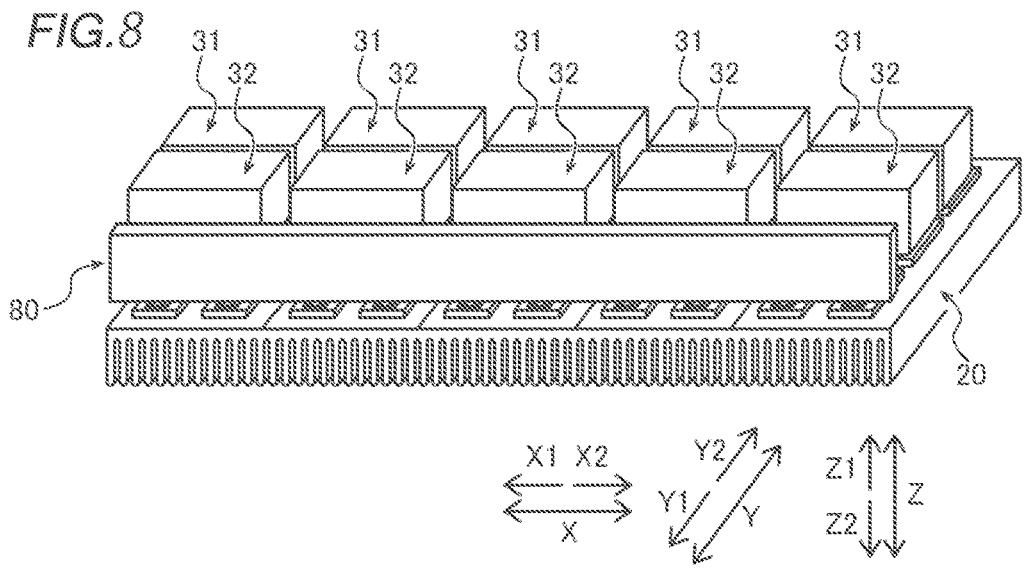
FIG. 8 is a diagram for illustrating the arrangement of a plurality of capacitors.

As shown in FIG. 8, a plurality of capacitors 31 and a plurality of capacitors 32 are arranged in the power conversion device 100. For example, five capacitors 31 and five capacitors 32 are arranged. That is, one capacitor 31 and one capacitor 32 are provided for each of the converter 10a, the converter 10b, the inverter 10c, the inverter 10d, and the inverter 10e. That is, one capacitor 31 and one capacitor 32 are provided for the two converters 10a connected in parallel, and one capacitor 31 and one capacitor 32 are provided for the two converters 10b connected in parallel. Similarly, one capacitor 31 and one capacitor 32 are provided for the two inverters 10c connected in parallel, one capacitor 31 and one capacitor 32 are provided for the two inverters 10d connected in parallel, and one capacitor 31 and one capacitor 32 are provided for the two inverters 10e connected in parallel. The plurality of capacitors 31 is aligned along the X direction on the Y2 direction side. The plurality of capacitors 32 is aligned along the X direction on the Y1 direction side.

Connection Between Modules and Capacitors

As shown in FIG. 6, in the first embodiment, the terminal surfaces 33 of the capacitors 31 and 32 face the terminal surfaces 14 of the modules 11 to 13. Specifically, the terminal surface 14 of each of the modules 11 to 13 aligned in a Y direction along the cooling surface 21 and the terminal surface 33 of each of the capacitors 31 and 32 aligned along the Y direction face each other along a Z direction. That is, the terminal surfaces 33 of the capacitors 31 and 32 face the cooling surface 21.

The power conversion device 100 includes conductors 40 and 50. The conductor 40 is connected to the terminals 31a, 31b, 32a, and 32b of the capacitors 31 and 32. The conductor 40 is arranged along the terminal surfaces 33 of the capacitors 31 and 32. Specifically, the conductor 40 extends along the terminal surfaces 33 on the Z2 direction side and along the Y direction. The conductor 50 is connected to the terminals 11a to 11c, 12a to 12c, 13a, and 13b of the modules 11 to 13. The conductor 50 is arranged along the terminal surfaces 14 of the modules 11 to 13. Specifically, the conductor 50 extends along the terminal surfaces 14 on the Z1 direction side and along the Y direction. The conductors 40 and 50 are flat plate-shaped members. The conductor 40 is an example of a "capacitor-side conductor" in the claims. The conductor 50 is an example of a "module-side conductor" in the claims.

As shown in FIG. 7, the conductor 40 connected to the capacitors 31 and 32 includes the conductor 41, the conductor 42, and the conductor 43. The conductor 41 is connected to the terminals 31a of the capacitor 31. Specifically, the conductor 41 has a flat plate shape extending along the terminal surface 33 of the capacitor 31. The conductor 41 is arranged across both the X direction and the Y direction along the X-Y plane so as to be connected to the two terminals 31a of the capacitor 31. An upper potential is applied to the conductor 41. The conductor 42 is connected to the terminals 32b of the capacitor 32. Specifically, the conductor 42 has a flat plate shape extending along the terminal surface 33 of the capacitor 32, similarly to the conductor 41. The conductor 42 is arranged across both the X direction and the Y direction along the X-Y plane so as to be connected to the two terminals 32b of the capacitor 32. A lower potential is applied to the conductor 42. The conductor 43 is connected to the terminals 31b of the capacitor 31 and the terminals 32a of the capacitor 32. Specifically, the conductor 43 has a flat plate shape extending along the terminal surfaces 33 of the capacitors 31 and 32. The conductor 43 is arranged in a zig-zag manner along the X-Y plane so as to be connected to the two terminals 31b of the capacitor 31 and the two terminals 32a of the capacitor 32. An intermediate potential is applied to the conductor 43.

The flat plate-shaped conductors 41 to 43 are laminated while being insulated from each other. That is, the conductors 41 to 43 are formed as laminated conductors. Specifically, the conductors 41 and 42 are laminated on the Z1 direction side of the conductor 43. A plate-shaped insulating member (not shown) is arranged between the conductor 43 and the conductors 41 and 42.

Each of the conductors 41 to 43 includes a mount(s) 44 connected to relay conductors 60 (see FIG. 6) described below. The mount(s) 44 is bent in a direction (Z1 direction) along surfaces of the capacitors 31 and 32 adjacent to the terminal surfaces 33 from a direction along the terminal surfaces 33. The mount(s) 44 includes holes into which fastening members 65 (see FIG. 6) such as screws are screwed for connection with the relay conductors 60. Connection by the relay conductors 60 is described below in detail. The mount(s) 44 is an example of a "capacitor-side mount" in the claims.

Figure 9:
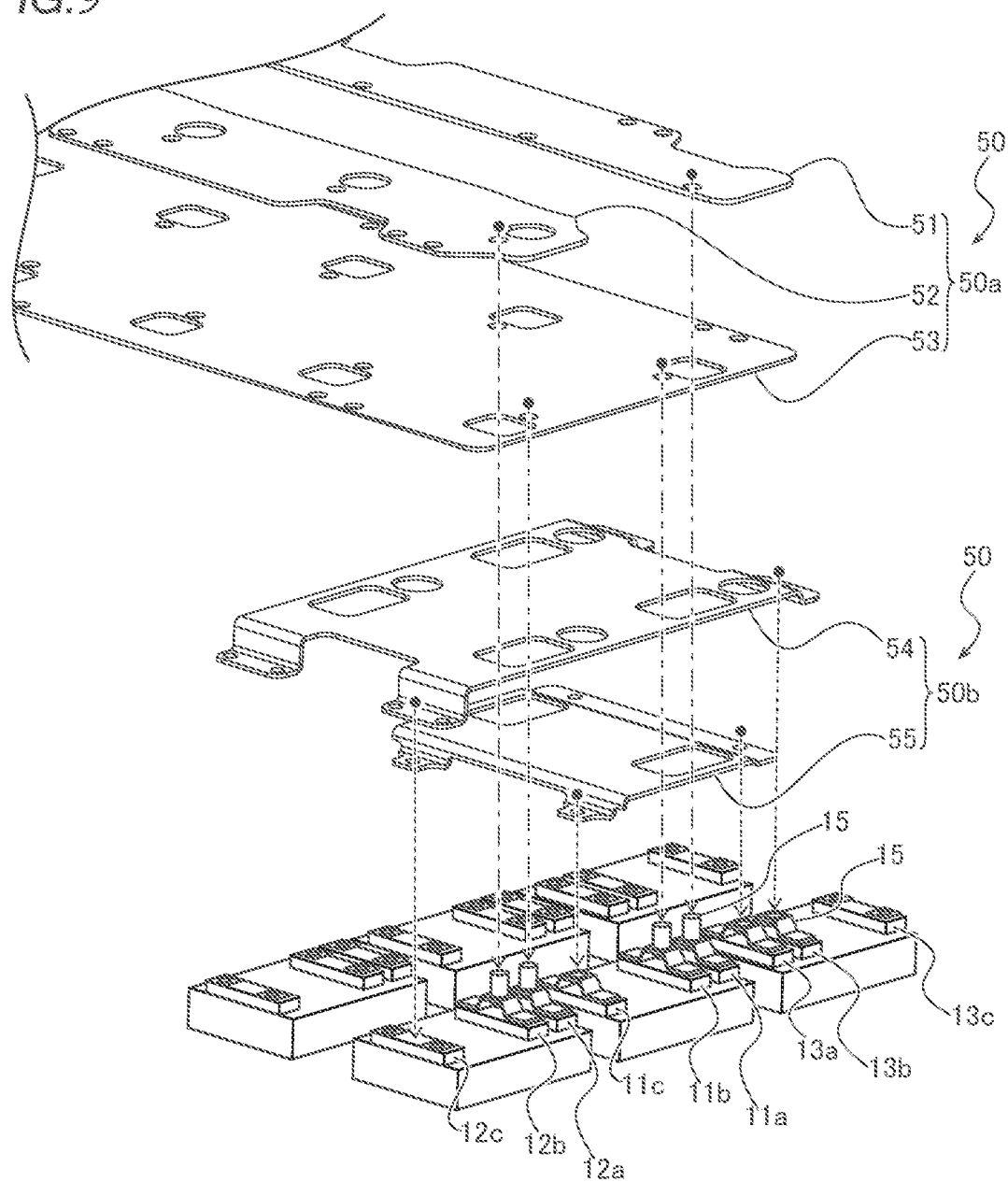
FIG. 9 is an exploded perspective view for illustrating conductors that connect the modules.

As shown in FIG. 9, the conductor 50 connected to the modules 11 to 13 includes a conductor 51, a conductor 52, a conductor 53, a conductor 54, and a conductor 55. The conductor 51 is an example of an "upper conductor" in the claims. The conductor 52 is an example of a "lower conductor" in the claims. The conductor 53 is an example of an "intermediate conductor" in the claims. The conductor 54 is an example of a "second connection conductor" in the claims. The conductor 55 is an example of a "first connection conductor" in the claims.

The conductors 51 to 55 each have a flat plate shape extending along the terminal surfaces 14 of the modules 11 to 13. In other words, the terminal surfaces 33 of the capacitors 31 and 32 and the terminal surfaces 14 of the modules 11 to 13 face the conductors 51 to 55. An upper potential is applied to the conductor 51. That is, the conductor 51 is an upper conductor (upper potential conductor) connected to the terminals 11a of the modules 11. A lower potential is applied to the conductor 52. That is, the conductor 52 is a lower conductor (lower potential conductor) connected to the terminals 12b of the modules 12. An intermediate potential is applied to the conductor 53. That is, the conductor 53 is an intermediate conductor (intermediate potential conductor) connected to the terminals 11b of the modules 11 and the terminals 12a of the modules 12. The conductor 54 connects the modules 12 to the modules 13. Specifically, the conductor 54 is connected to the terminals 12c of the modules 12 and the terminals 13b of the modules 13. The conductor 55 connects the modules 11 to the modules 13. Specifically, the conductor 55 is connected to the terminals 11c of the modules 11 and the terminals 13a of the modules 13. That is, the conductors 51, 53, and 55 are connected to the modules 11. The conductors 52, 53, and 54 are connected to the modules 12. The conductors 54 and 55 are connected to the modules 13. The conductors 51 to 55 are electrically connected to the terminals 11a to 11c, 12a to 12c, 13a, and 13b of the modules 11 to 13 by being fastened by fastening members such as screws from the Z1 direction side.

In the first embodiment, the conductor 51, the conductor 52, and the conductor 53 are laminated while being insulated from each other to form a laminated conductor 50a. The conductors 54 and 55 are laminated separately from the laminated conductor 50a while being insulated from each other to form a laminated conductor 50b. The laminated conductor 50a is an example of a "first laminated conductor" in the claims. The laminated conductor 50b is an example of a "second laminated conductor" in the claims.

Specifically, in the laminated conductor 50a, the conductors 51 and 52 overlap the conductor 53 on the Z1 direction side of the conductor 53. The conductors 51 and 52 are arranged along the X-Y plane and arranged adjacent to each other in the Y direction. The conductors 51 and 52 and the conductor 53 are insulated from each other by an insulating member (not shown). In the laminated conductor 50b, the conductor 54 overlaps the conductor 55 on the Z1 direction side of the conductor 55. The conductors 54 and 55 are insulated from each other by an insulating member (not shown). Two laminated conductors 50a are provided to integrally connect the converters 10a and 10b and the inverters 10c to 10e, respectively. That is, one of the two laminated conductors 50a extends along the X direction so as to integrally connect the modules 11 to 13 of the converters 10a and 10b. The other of the two laminated conductors 50a extends along the X direction so as to integrally connect the modules 11 to 13 of the inverters 10c to 10e. The two laminated conductors 50a are connected to each other between the converters 10a and 10b and the inverters 10c to 10e. On the other hand, one laminated conductor 50b is separately provided for each of the converter 10a, the converter 10b, the inverter 10c, the inverter 10d, and the inverter 10e.

The conductors 53, 54, and 55 are arranged so as to avoid the terminals 11a and 12b as viewed from the Z1 direction side such that the conductors 51 and 52 arranged on the Z1 direction side are connected to the modules 11 and 12 by fastening members. Specifically, the conductors 53 to 55 include holes in regions overlapping the terminals 11a as viewed from the Z1 direction side. The conductors 53 and 54 include holes in regions overlapping the terminals 12b as viewed from the Z1 direction side. Similarly, the conductors 54 and 55 are arranged so as to avoid the terminals 11b and 12a as viewed from the Z1 direction side such that the conductor 53 is connected to the modules 11 and 12. Specifically, the conductors 54 and 55 include holes in regions overlapping the terminals 11b as viewed from the Z1 direction side. The conductor 54 includes holes in regions overlapping the terminals 12a as viewed from the Z1 direction side. The laminated conductor 50a and the laminated conductor 50b are separately connected to the modules 11 to 13. That is, after the conductors 54 and 55 are fastened and connected to the modules 11 to 13 as the laminated conductor 50b by fastening members, the conductors 51 to 53 are fastened and connected to the modules 11 to 13 as the laminated conductor 50a by fastening members. Therefore, after the conductors 54 and 55 are integrally connected to the modules 11 to 13, the conductors 51 to 53 are integrally connected to the modules 11 to 13. Thus, the conductors 51 to 53 do not include holes in order to avoid connecting portions to connect the conductors 54 and 55. The conductors 51 to 53 are integrally connected as the laminated conductor 50a, and thus the conductors 51 and 52 are arranged so as to avoid the terminals 11b and 12a to which the conductor 53 is connected, as viewed from the Z1 direction side. The terminals 11a to 11c of the modules 11, the terminals 12a and 12b of the modules 12, and the terminals 13a and 13b of the modules 13 are connected to the conductor 50 (laminated conductors 50a and 50b) via relay conductors 15 by fastening members.

As shown in FIG. 6, the power conversion device 100 includes the relay conductors 60 that connect the conductor 40 on the capacitors 31 and 32 side and the conductor 50 on the modules 11 to 13 side to each other. The conductors 40 and 50 are connected to each other by the relay conductors 60 while the terminal surfaces 33 of the capacitors 31 and 32 and the terminal surfaces 14 of the modules 11 to 13 face each other. Specifically, the conductors 40 and 50 are connected to each other on the end sides of the terminal surfaces 33 in the direction (Y direction) along the terminal surfaces 33. That is, the relay conductors 60 connect the conductor 40 and the conductor 50 to each other on the end sides of the terminal surfaces 33 in the Y direction. Specifically, the relay conductors 60 connect the conductor 40 and the conductor 50 to each other on the Y2 direction end side of the terminal surface 33 of the capacitor 31 and the Y1 direction end side of the terminal surface 33 of the capacitor 32. That is, the conductors 40 and 50 are connected to each other at ends of the capacitors 31 and 32 in a direction in which the capacitors 31 and 32 are aligned. In other words, the conductors 40 and 50 are connected to each other on the outer sides in a direction (Y direction) intersecting a direction (Z direction) in which the terminal surfaces 33 of the capacitors 31 and 32 and the terminal surfaces 14 of the modules 11 to 13 face each other.

Specifically, the conductors 41 and 51 to which an upper potential is applied are connected to each other by the relay conductor 60. That is, an end of the conductor 41 on the Y2 direction side and an end of the conductor 51 on the Y2 direction side are connected to each other via the relay conductor 60 such that the terminals 31a of the capacitor 31 and the terminals 11a of the modules 11 are electrically connected to each other. The conductors 42 and 52 to which a lower potential is applied are connected to each other by the relay conductor 60. That is, an end of the conductor 42 on the Y1 direction side and an end of the conductor 52 on the Y1 direction side are connected to each other via the relay conductor 60 such that the terminals 32b of the capacitor 32 and the terminals 12b of the modules 12 are electrically connected to each other. The conductors 43 and 53 to which an intermediate potential is applied are connected to each other by the relay conductor 60. That is, ends of the conductors 43 and 53 on the Y1 direction side are connected to each other via the relay conductor 60, and ends of the conductors 43 and 53 on the Y2 direction side are connected to each other via the relay conductor 60 such that the terminals 31b of the capacitor 31, the terminals 32a of the capacitor 32, the terminals 11b of the modules 11, and the terminals 12a of the modules 12 are electrically connected to each other.

Figure 10:
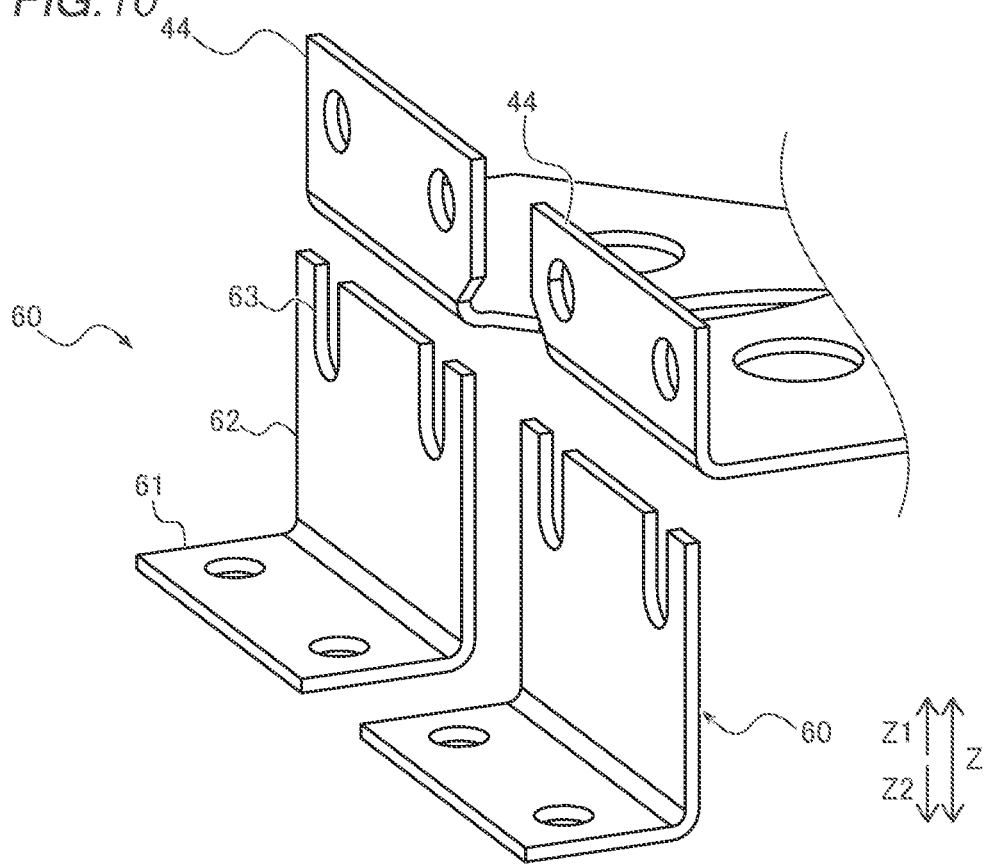
FIG. 10 is a diagram for illustrating relay conductors.

As shown in FIG. 10, each of the relay conductors 60 has an L-shape extending along the terminal surfaces 14 of the modules 11 to 13 and along a direction (Z direction) facing the terminal surfaces 14. Specifically, the relay conductor 60 includes a portion 61 extending along the terminal surfaces 14 of the modules 11 to 13 and a portion 62 extending along the Z direction, which is the direction facing the terminal surfaces 14. That is, the portion 61 is a portion extending along the X-Y plane (see FIG. 6). Therefore, the portion 61 is arranged parallel to the conductors 51 to 55. The portion 62 is a portion extending along an X-Z plane (see FIG. 6). The portion 62 is arranged parallel to the mounts 44 of the conductors 41 to 43. In the relay conductors 60, the portions 61 are connected to the conductors 51 to 55 by fastening members 64 (see FIG. 6) such as screws, and the portions 62 are connected to the conductors 41 to 43 by the fastening members 65 (see FIG. 6) such as screws. The relay conductors 60 are connected to the mounts 44 of the conductors 41 to 43 at the portions 62. The portions 62 are examples of a "relay conductor-side mount" in the claims.

The portion 62 includes notched holes 63. The notched holes 63 are open in the direction (Z direction) in which the terminal surfaces 33 of the capacitors 31 and 32 and the terminal surfaces 14 of the modules 11 to 13 face each other. Specifically, the fastening members 65 for connecting the mounts 44 of the conductors 41 to 43 to the portions 62 of the relay conductors 60 are screwed into the notched holes 63. The notched holes 63 are open in a direction (Z1 direction) in which the capacitors 31 and 32 are away from the modules 11 to 13.

In the power conversion device 100, the laminated conductor 50b is connected to the modules 11 to 13 arranged on the cooling surface 21, and then the laminated conductor 50a is connected. The conductor 40 is connected to the capacitors 31 and 32 separately from the modules 11 to 13. The conductor 40 connected to the capacitors 31 and 32 and the conductor 50 (laminated conductors 50a and 50b) connected to the modules 11 to 13 are connected to each other by the relay conductors 60. The notched holes 63 provided in the portions 62 of the relay conductors 60 can connect the relay conductors 60 and the conductor 40 while adjusting their positions in the Z direction with respect to the conductor 40.

As shown in FIG. 6, the AC conductor 70 is connected to the terminal 13c of the module 13. AC power is input to or output from the AC conductor 70. That is, AC power is input from the transformer 101b to the AC conductors 70 (input conductors) connected between a secondary winding of the transformer 101b and the terminals 13c of the modules 13 in the converters 10a and 10b. AC power is output from the inverters 10c to 10e to the AC conductors 70 (output conductors) connected between the terminals 13c of the modules 13 in the inverters 10c to 10e and windings of the motors 101c.

In each of the converter 10a, the converter 10b, the inverter 10c, the inverter 10d, and the inverter 10e, the modules 11 to 13 are arranged in a common arrangement order. Furthermore, in each of the converter 10a, the converter 10b, the inverter 10c, the inverter 10d, and the inverter 10e, the orientation of the terminals of the modules 11 to 13 is also common. That is, the modules 12, 11, and 13 are arranged in this order from the Y1 direction side to the Y2 direction side. In the terminal arrangement, the terminals 12c, 12b, 12a, 11c, 11b, 11a, 13a, 13b, and 13c are arranged in this order from the Y1 direction side to the Y2 direction side. That is, the module 13 including the terminal 13c is arranged at an end on one side (Y2 direction side) in a direction in which the three modules 11 to 13 are aligned. The terminal 13c to which the AC conductor 70 is connected is arranged at a Y2 direction side end of the module 13 arranged at the end on the Y2 direction side. Therefore, the AC conductor 70 is arranged at an end of the aligned modules 11 to 13 on the Y2 direction side. Specifically, in the power conversion device 100, the AC conductor 70 to which AC power is input and the AC conductor 70 from which AC power is output are arranged on the common Y2 direction side. In the module 11, the terminals 11a to 11c may be arranged in the opposite order.

As shown in FIG. 8, the power conversion device 100 includes a gate substrate 80. The gate substrate 80 outputs gate signals for controlling the switching operations of the switching elements Q1 to Q4 based on control signals from a controller (not shown). The gate signals are signals based on pulse width modulation (PWM) signals, for example. The gate signals output from the gate substrate 80 are input between a gate terminal (not shown) and a source terminal (not shown) provided on the terminal surface 14. The gate substrate 80 is arranged on the Y1 direction side opposite to the Y2 direction side on which the AC conductor 70 is arranged with the capacitors 31 and 32 interposed between the gate substrate 80 and the AC conductor 70.

Advantageous Effects of First Embodiment

According to the first embodiment, the following advantageous effects are achieved.

According to the first embodiment, the modules 11 to 13 (semiconductor modules) include the terminal surfaces 14 (module-side terminal surfaces) on which the terminals 11a to 11c, 12a to 12c, and 13a to 13c (module-side terminals) of the modules 11 to 13 are arranged. The capacitors 31 and 32 include the terminal surfaces 33 (capacitor-side terminal surfaces) on which the terminals 31a, 31b, 32a, and 32b (capacitor-side terminals) of the capacitors 31 and 32 are arranged, and the terminal surfaces 33 (capacitor-side terminal surfaces) face the terminal surfaces 14 of the modules 11 to 13. Accordingly, the terminal surfaces 33 and the terminal surfaces 14 face each other, and thus arrangement with exposure of the terminals 31a, 31b, 32a, and 32b on side surfaces of the capacitors 31 and 32 other than the modules 11 to 13 side can be reduced or prevented. Therefore, a device arranged separately from the capacitors 31 and 32 and the modules 11 to 13 can be arranged close to the capacitors 31 and 32 without considering insulation distances. Consequently, an increase in the size of the power conversion device 100 can be reduced or prevented.

According to the first embodiment, the power conversion device 100 includes the conductor 40 (capacitor-side conductor) connected to the terminals 31a, 31b, 32a, and 32b (capacitor-side terminals) and arranged along the terminal surfaces 33 (capacitor-side terminal surfaces), and the conductor 50 (module-side conductor) connected to the terminals 11a to 11c, 12a to 12c, and 13a to 13c (module-side terminals) and arranged along the terminal surfaces 14 (module-side terminal surfaces). The conductor 40 and the conductor 50 are connected to each other on the end sides of the terminal surfaces 33 in the direction along the terminal surfaces 33 while the terminal surfaces 33 and the terminal surfaces 14 face each other. Accordingly, the conductor 40 and the conductor 50 are connected to each other on the end sides of the terminal surfaces 33, and thus the conductor 40 and the conductor 50 can be connected to each other from the outer sides of the capacitors 31 and 32 and the modules 11 to 13 on the end sides of the terminal surfaces 33 without inserting a tool or the like between the capacitors 31 and 32 and the modules 11 to 13. Therefore, even when the terminal surfaces 33 and the terminal surfaces 14 face each other, it is not necessary to provide a gap to insert a tool or the like between the capacitors 31 and 32 and the modules 11 to 13, and thus the capacitors 31 and 32 and the modules 11 to 13 can be arranged close to each other. Consequently, a distance between the capacitors 31 and 32 and the modules 11 to 13 can be reduced, and thus an increase in the size of the power conversion device 100 can be further reduced or prevented.

According to the first embodiment, the power conversion device includes the relay conductors 60 to connect the conductor 40 (capacitor-side conductor) and the conductor 50 (module-side conductor) to each other on the end sides of the terminal surfaces 33 in the direction along the terminal surfaces 33 (capacitor-side terminal surfaces). Accordingly, the relay conductors 60 are provided separately from the conductor 40 and the conductor 50, and thus the conductor 40 and the conductor 50 can be connected to each other by the relay conductors 60 without changing the shapes of the conductors 40 and 50 facing each other. Therefore, the conductor 40 and the conductor 50 can be connected to each other by the relay conductors 60 while the complexity of the shapes of the conductors 40 and 50 is reduced or prevented.

According to the first embodiment, the conductor 40 (capacitor-side conductor) includes the mounts 44 (capacitor-side mounts) bent in the direction along the surfaces of the capacitors 31 and 32 adjacent to the terminal surfaces 33 from the direction along the terminal surfaces 33 (capacitor-side terminal surfaces). The relay conductors 60 each have an L-shape extending along the terminal surfaces 14 (module-side terminal surfaces) and along the direction facing the terminal surfaces 14, and include the portion 62 (relay conductor-side mount) connected to the mount 44 in the portion extending along the direction facing the terminal surfaces 14. The portion 62 includes the notched holes 63 opening in the direction in which the terminal surfaces 33 and the terminal surfaces 14 face each other. Accordingly, the portion 62 of the relay conductor 60 having an L-shape includes the notched holes 63 opening in the direction in which the terminal surfaces 33 and the terminal surfaces 14 face each other, and thus even when a manufacturing tolerance occurs in the direction in which the terminal surfaces 33 and the terminal surfaces 14 face each other, the conductor 40 and the relay conductor 60 can be easily connected to each other by connecting the notched holes 63 to the mount 44. Therefore, even when a manufacturing tolerance occurs in the direction in which the terminal surfaces 33 and the terminal surfaces 14 face each other, the assembly operation can be easily performed.

According to the first embodiment, the power converter 10 includes the converters 10a and 10b to convert input AC power into DC power, and the inverters 10c to 10e to convert input DC power into AC power and output the AC power, and the plurality of modules 11 to 13 (semiconductor modules) is aligned. The plurality of modules 11 to 13 includes the module 13 (input/output module) including the terminal 13c (AC terminal) to which the AC conductor 70 to which or from which AC power is input or output is connected, and the module 13 is arranged at the end on one side in the direction in which the plurality of modules 11 to 13 is aligned. The terminal 13c is arranged on one side in the module 13. Accordingly, the terminal 13c is arranged on one side in the plurality of aligned modules 11 to 13, and thus an increase in the length of the AC conductor 70 connected to the module 13 can be reduced or prevented. Therefore, an increase in the weight of the entire power conversion device 100 can be reduced or prevented.

According to the first embodiment, the power conversion device 100 includes the conductor 50 (module-side conductor) connected to the terminals 11a to 11c, 12a to 12c, and 13a to 13c (module-side terminals) and arranged along the terminal surfaces 14 (module-side terminal surfaces), and the power converter 10 includes the inverters 10c to 10e (three-level inverters) to which three levels of potential including an upper potential, an intermediate potential, and a lower potential are input, and the converters 10a and 10b (three-level converters) from which three levels of potential including an upper potential, an intermediate potential, and a lower potential are output. The conductor 50 includes the conductor 51 (upper conductor) to which an upper potential is applied, the conductor 53 (intermediate conductor) to which an intermediate potential is applied, and the conductor 52 (lower conductor) to which a lower potential is applied, and the terminal surfaces 33 (capacitor-side terminal surfaces) of the capacitors 31 and 32 face the conductors 51, 52, and 53. Accordingly, even when the power converter 10 includes at least one of the three-level inverters or the three-level converters, the terminal surfaces 33 face the conductors 51, 52, and 53, and thus arrangement with exposure of the terminals 31a, 31b, 32a, and 32b (capacitor-side terminals) and the conductors 51 to 53 on the side surfaces of the capacitors 31 and 32 other than the modules 11 to 13 (semiconductor modules) side can be reduced or prevented. Therefore, even when the power converter 10 includes at least one of the three-level inverters or the three-level converters, a device arranged separately from the capacitors 31 and 32 and the modules 11 to 13 can be arranged close to the capacitors 31 and 32, and thus an increase in the size of the power conversion device 100 can be reduced or prevented.

According to the first embodiment, the modules 11 to 13 (semiconductor modules) include the module 11 (first module) including one switching element Q1 and one clamp diode D1 and connected to the conductor 51 (upper conductor) and the conductor 53 (intermediate conductor), the module 12 (second module) including one switching element Q4 and one clamp diode D2 and connected to the conductor 53 and the conductor 52 (lower conductor), and the module 13 (third module) including two switching elements Q2 and Q3 and connected to the modules 11 and 12. The conductor 50 (module-side conductor) includes the conductor 55 (first connection conductor) to connect the module 11 to the module 13, and the conductor 54 (second connection conductor) to connect the module 12 to the module 13, the conductor 51, the conductor 52, and the conductor 53 are laminated while being insulated from each other to form the laminated conductor 50a (first laminated conductor), and the conductor 54 and the conductor 55 are laminated separately from the laminated conductor 50a while being insulated from each other to form the laminated conductor 50b (second laminated conductor). When each of the plurality of laminated conductors 50 is connected, it is necessary to provide holes in the other conductors in order to arrange a fastening member such as a screw at the connecting portion of one of the plurality of conductors 50. In consideration of this point, in the first embodiment, the conductor 51, the conductor 52, and the conductor 53 are laminated while being insulated from each other to form the laminated conductor 50a, and the conductor 54 and the conductor 55 are laminated separately from the laminated conductor 50a while being insulated from each other to form the laminated conductor 50b. Accordingly, the laminated conductor 50a formed by the conductors 51, 52, and 53 and the laminated conductor 50b formed by the conductors 54 and 55 can be separately connected to the modules 11 to 13. Therefore, as compared with a case in which the conductors 51, 52, and 53 and the conductors 54 and 55 are collectively formed as one laminated conductor, the number of holes for avoiding the connecting portions can be reduced, and thus a decrease in the cross-sectional areas of the conductors can be reduced or prevented. Consequently, in the conductors 51, 52, and 53 and the conductors 54 and 55, local heat generation due to current concentration can be reduced or prevented, and an increase in inductance can be reduced or prevented.

According to the first embodiment, the power converter 10 and the capacitors 31 and 32 are mounted on the railroad vehicle 101. Accordingly, even when the power converter 10 and the capacitors 31 and 32 are mounted on the railroad vehicle 101, a device separate from the modules 11 to 13 (semiconductor modules) and the capacitors 31 and 32 can be arranged close to the capacitors 31 and 32, and thus an increase in the size of the power conversion device 100 mounted on the railroad vehicle 101 can be effectively reduced or prevented.

Second Embodiment

A second embodiment is now described with reference to FIGS. 11 to 13. In the second embodiment, a two-level power converter 210 is provided, unlike the first embodiment in which the three-level power converter 10 is provided. In the second embodiment, the same or similar configurations as those of the first embodiment are denoted by the same reference numerals, and description thereof is omitted.

Figure 11:
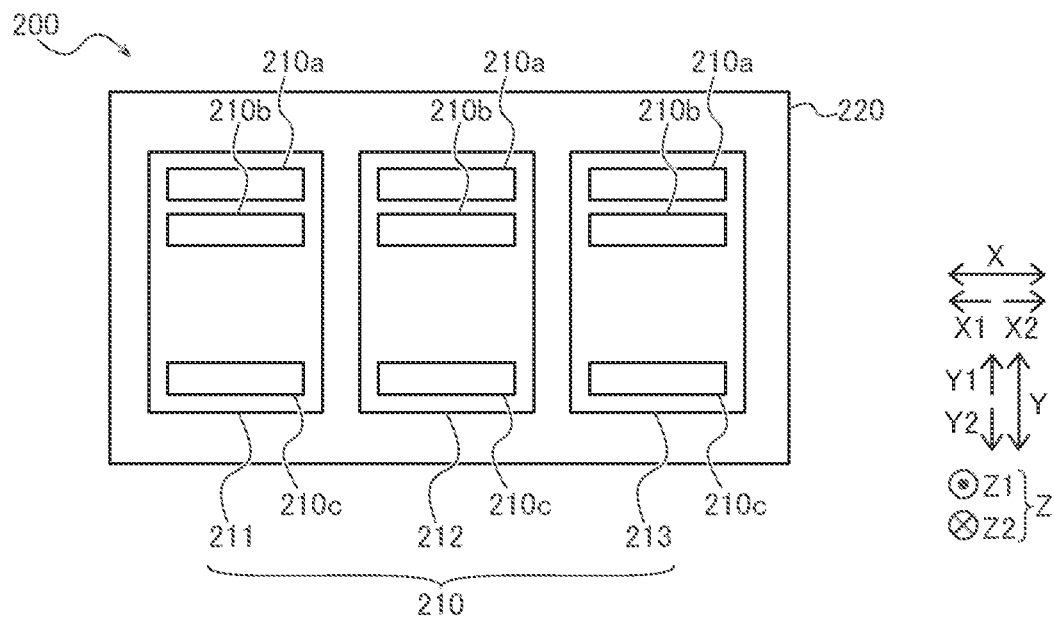
FIG. 11 is a schematic view for illustrating the arrangement of modules in a power conversion device according to a second embodiment.
Figure 12:
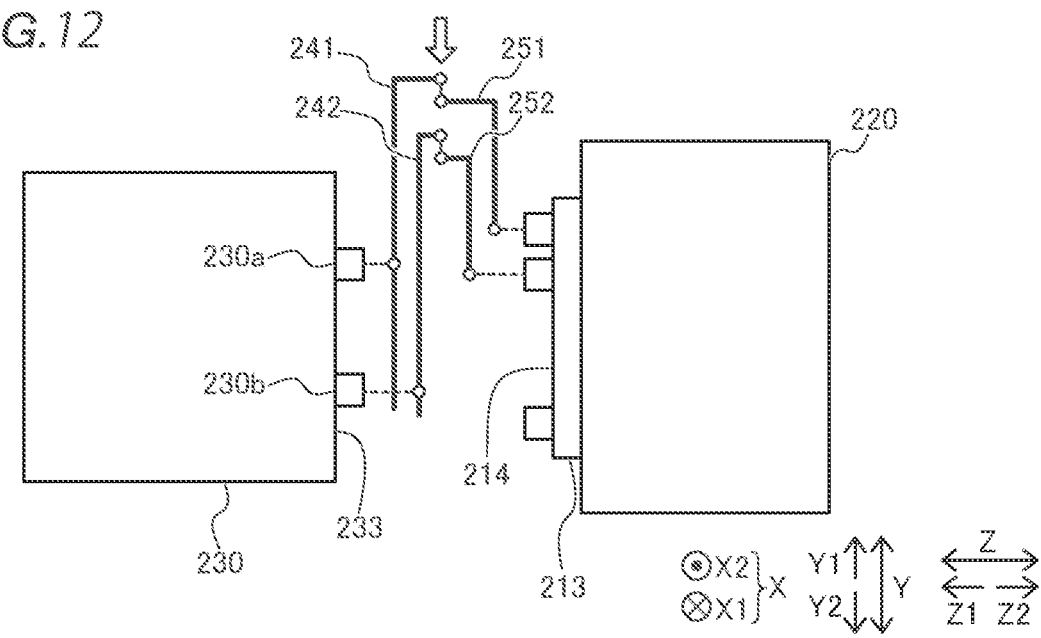
FIG. 12 is a diagram for illustrating the arrangement of a capacitor and the modules according to the second embodiment.

As shown in FIGS. 11 and 12, a power conversion device 200 according to the second embodiment includes a power converter 210, a cooling body 220, and a capacitor 230. The power converter 210 includes three modules 211, 212, and 213. The modules 211 to 213 are aligned in an X direction on a cooling surface of the cooling body 220. Each of the modules 211 to 213 includes a terminal 210a, a terminal 210b, and a terminal 210c. The terminals 210a to 210c are arranged on terminal surfaces 214 provided on the modules 211 to 213. The power converter 210 is an example of a "power converter", an "inverter", or a "two-level inverter" in the claims. The terminals 210a to 210c are examples of a "module-side terminal" in the claims. The modules 211 to 213 are examples of a "semiconductor module" in the claims. The terminal surfaces 214 are examples of a "module-side terminal surface" in the claims.

As shown in FIG. 12, the capacitor 230 includes terminals 230a and 230b. The terminals 230a and 230b are arranged on a terminal surface 233 of the capacitor 230. In the second embodiment, the terminal surface 233 of the capacitor 230 is arranged so as to correspond to the terminal surfaces 214 of the modules 211 to 213. The terminal surface 233 is an example of a "capacitor-side terminal surface" in the claims. The terminals 230a and 230b are examples of a "capacitor-side terminal" in the claims.

Figure 13:
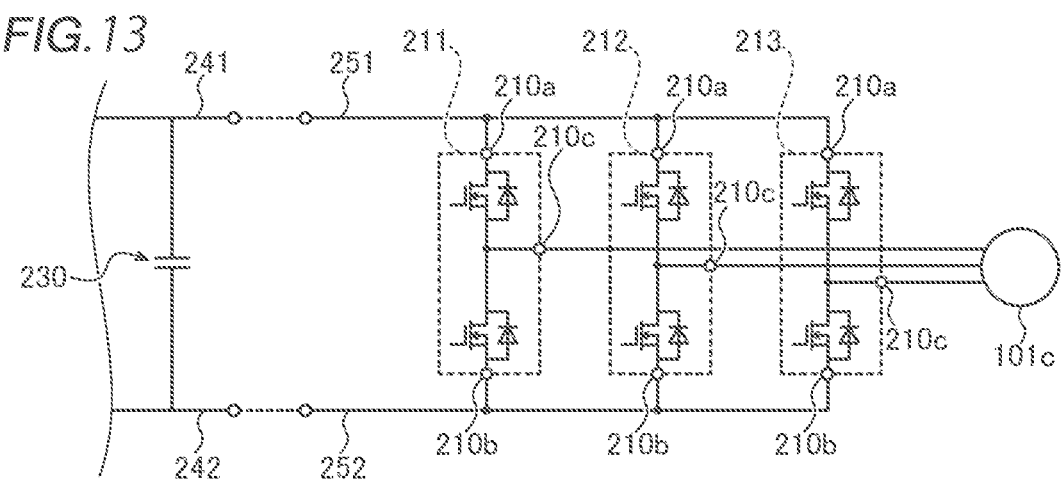
FIG. 13 is a circuit diagram showing an equivalent circuit of the power conversion device according to the second embodiment.

As shown in FIG. 13, each of the modules 211 to 213 includes a pair of switching elements connected in series to each other. The pair of switching elements is MOSFETs, for example. In FIG. 13, diodes connected in parallel to the switching elements represent parasitic diodes of the MOSFETs. The terminal 210a is connected to the positive electrode side of the pair of switching elements. The terminal 210b is connected to the negative electrode side of the pair of switching elements. The terminal 210c is connected between the pair of switching elements. In other words, in the power converter 210, a two-level power conversion circuit is formed. For example, a positive electrode-side switching element and a negative electrode-side switching element of the pair of switching elements included in each of the modules 211 to 213 constitute the upper arm side and the lower arm side of an inverter circuit, respectively.

As shown in FIGS. 12 and 13, the power conversion device 200 includes conductors 241, 242, 251, and 252. The conductors 241 and 242 are examples of a "capacitor-side conductor" in the claims. The conductor 251 is an example of a "module-side conductor" or an "upper conductor" in the claims. The conductor 252 is an example of a "module-side conductor" or a "lower conductor" in the claims.

The conductor 241 is connected to the terminal 230a of the capacitor 230. The conductor 242 is connected to the terminal 230b of the capacitor 230. The conductors 241 and 242 are arranged along the terminal surface 233 of the capacitor 230 and are bent in a Z2 direction on the Y1 direction side. The conductor 251 is connected to the terminals 210a of the modules 211 to 213. The conductor 252 is connected to the terminals 210b of the modules 211 to 213. The conductors 251 and 252 are arranged along the terminal surfaces 214 of the modules 211 to 213 and are bent in a Z1 direction on the Y1 direction side. That is, the terminal surface 233 of the capacitor 230 faces the conductors 251 and 252.

The conductors 241 and 251 are connected to each other from an outer side (Y1 direction side) at a Y1 direction side end of the terminal surface 233 of the capacitor 230. Similarly, the conductors 242 and 252 are connected to each other from the outer side (Y1 direction side) at the Y1 direction side end of the terminal surface 233 of the capacitor 230.

As described above, the power converter 210 and the capacitor 230 of the power conversion device 200 are connected to each other to form a two-level power conversion circuit. That is, in the second embodiment, an upper potential is applied to the conductors 251 and 241, and a lower potential is applied to the conductors 252 and 242. The power converter 210 outputs three-phase AC power for operating a motor 101c by constituting an inverter circuit to which two levels of potential including an upper potential and a lower potential are input.

Advantageous Effects of Second Embodiment

According to the second embodiment, the following advantageous effects are achieved.

According to the second embodiment, the power conversion device 200 includes the conductors 251 and 252 (module-side conductors) connected to the terminals 210a to 210c (module-side terminals) and arranged along the terminal surfaces 214 (module-side terminal surfaces), and the power converter 210 includes the two-level inverter to which two levels of potential including an upper potential and a lower potential are input. The conductors 251 and 252 include the conductor 251 (upper conductor) to which an upper potential is applied, and the conductor 252 (lower conductor) to which a lower potential is applied, and the terminal surface 233 (capacitor-side terminal surface) of the capacitor 230 faces the conductor 251 and the conductor 252. Accordingly, even when the power converter 210 includes the two-level inverter that is at least one of the two-level inverter or a two-level converter, the terminal surface 233 faces the conductors 251 and 252, and thus arrangement with exposure of the terminals 230a and 230b (capacitor-side terminals) and the conductors 251 and 252 on side surfaces of the capacitor 230 other than the modules 211 to 213 (semiconductor modules) side can be reduced or prevented. Therefore, even when the power converter 210 includes at least one of the two-level inverter or the two-level converter, a device arranged separately from the capacitor 230 and the modules 211 to 213 can be arranged close to the capacitor 230, and thus an increase in the size of the power conversion device 200 can be reduced or prevented.

The remaining advantageous effects of the second embodiment are similar to those of the first embodiment.

Modified Examples

The embodiments disclosed this time must be considered as illustrative in all points and not restrictive. The scope of the present invention is not shown by the above description of the embodiments but by the scope of claims for patent, and all modifications (modified examples) within the meaning and scope equivalent to the scope of claims for patent are further included.

Figure 14:
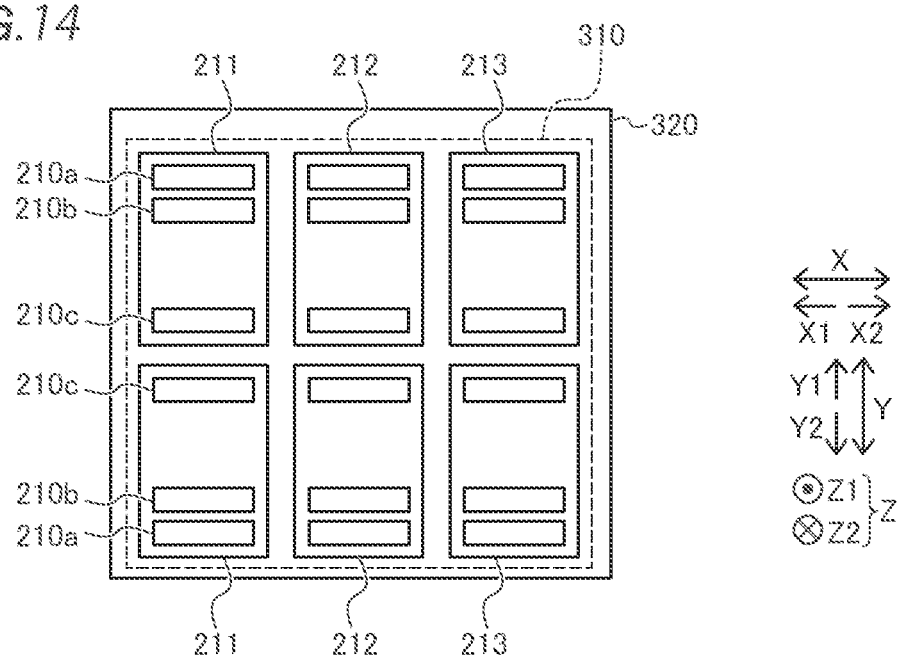
FIG. 14 is a schematic view for illustrating the arrangement of modules in a power conversion device according to a modified example of the second embodiment.
Figure 15:
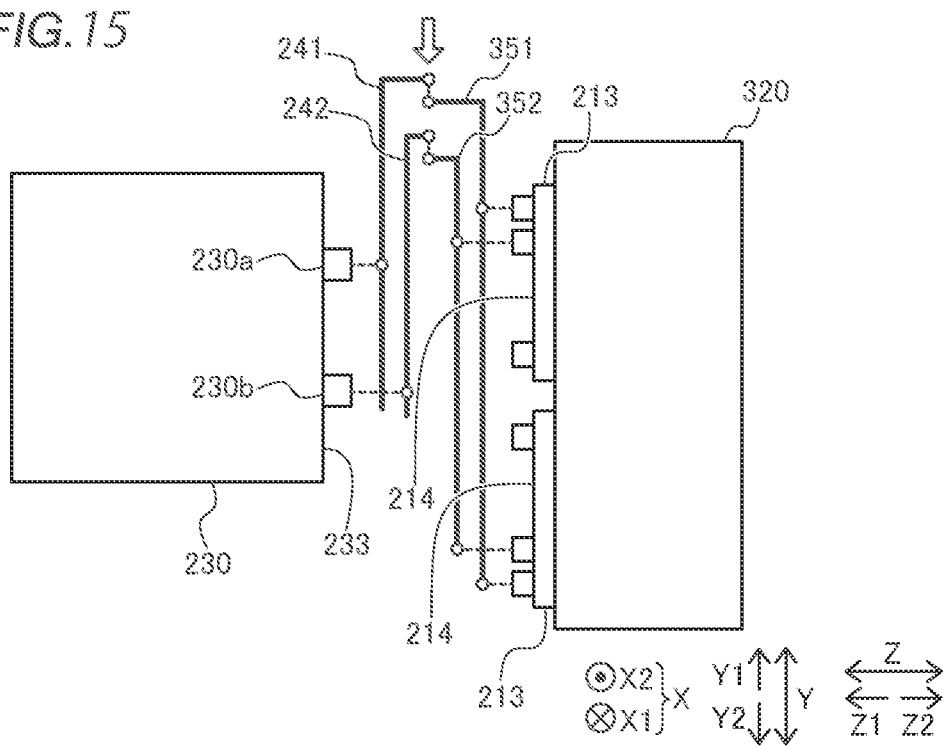
FIG. 15 is a diagram for illustrating the arrangement of a capacitor and the modules according to the modified example of the second embodiment.
Figure 16:
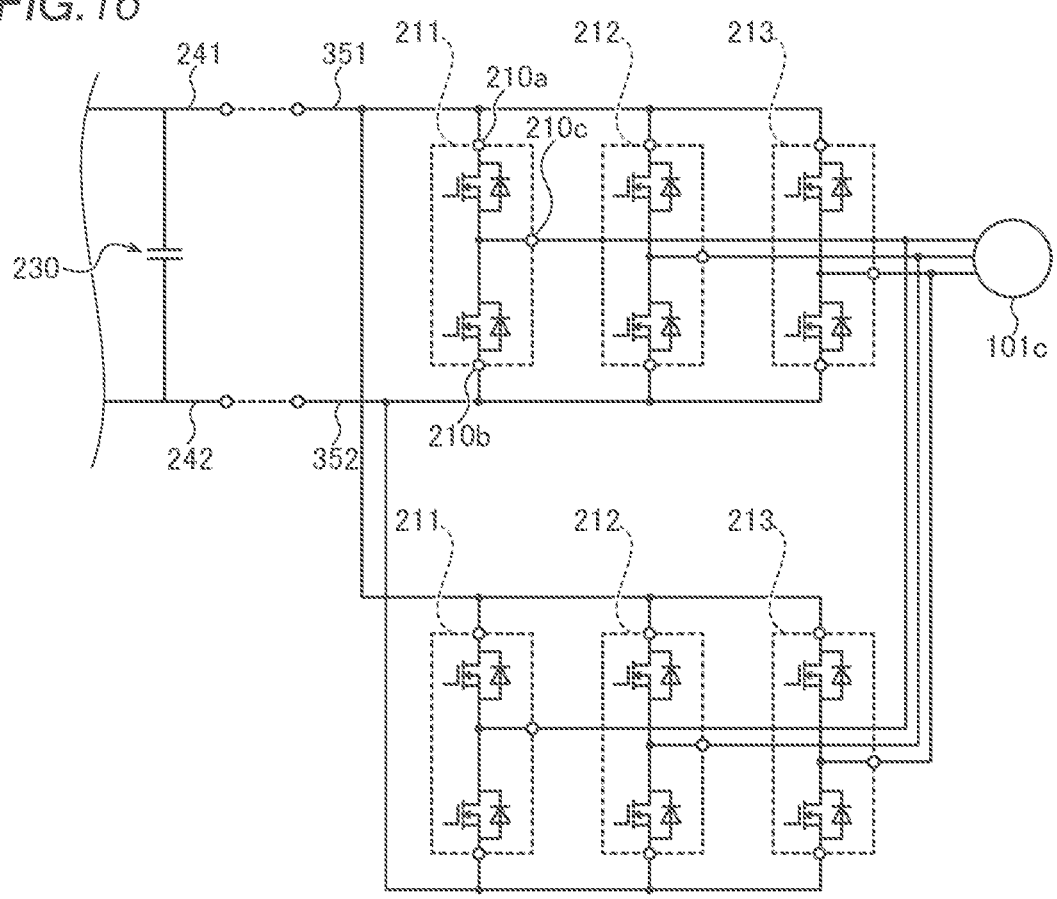
FIG. 16 is a circuit diagram showing an equivalent circuit of the power conversion device according to the modified example of the second embodiment.

For example, while one module 211, one module 212, and one module 213 (semiconductor modules) are provided in the power converter 210 that outputs three-phase AC power in the aforementioned second embodiment, the present invention is not limited to this. In the present invention, two modules 211, two modules 212, and two modules 213 may alternatively be provided as in a power converter 310 according to a modified example shown in FIGS. 14 to 16. Specifically, on a cooling body 320, the modules 211 to 213 are arranged in two rows in a Y direction. Also in this case, a terminal surface 233 of a capacitor 230 and terminal surfaces 214 of the aligned modules 211 to 213 face each other.

In the power converter 310, terminals 210a of the two modules 211, the two modules 212, and the two modules 213 aligned in the Y direction are connected to each other by a conductor 351. Furthermore, terminals 210b of the two modules 211, the two modules 212, and the two modules 213 aligned in the Y direction are connected to each other by a conductor 352. The conductors 351 and 352 are similar to the conductors 251 and 252, respectively. That is, the conductors 351 and 352 are arranged along the terminal surfaces 214 of the modules 211 to 213 and are bent in a Z1 direction. The conductor 351 is connected to the conductor 241, and the conductor 352 is connected to the conductor 242. In the power converter 310, the two modules 211, the two modules 212, and the two modules 213 are provided to constitute two inverter circuits connected in parallel to each other.

In the power converter 310 according to the modified example, conductors 241 and 242 (capacitor-side conductors) may be connected to the conductors 351 and 352 (module-side conductors), respectively, at ends in a direction (X direction) in which the modules 211 to 213 are aligned. That is, the capacitor-side conductors and the module-side conductors may be arranged along the X direction, and the capacitor-side conductors may be connected to the module-side conductors on the X1 direction side or the X2 direction side. In particular, when one set of modules 211 to 213 is connected in parallel to the other set of modules 211 to 213 and operates, a difference between an inductance on the modules 211 to 213 side in a Y1 direction and an inductance on the modules 211 to 213 side in a Y2 direction can be reduced or prevented due to the connection in the X direction.

In the power converter 310, the modules 211 to 213 may be arranged reversely in the Y direction. That is, terminals 210a to 210c of the modules 211 to 213 may be arranged reversely.

While two inverter circuits connected in parallel to each other are formed by using the two modules 211, the two modules 212, and the two modules 213 (semiconductor modules) in the power converter 310 according to the modified example, the present invention is not limited to this. In the present invention, two-group inverter circuits may alternatively be arranged by changing the connection on the output side of the power converter 310. That is, the two inverter circuits may be connected to different loads by changing the connection of the terminals 210c on the output side of the modules 211 to 213.

While the power converter 210 includes the two-level inverter in the aforementioned second embodiment, the present invention is not limited to this. For example, the power converter may alternatively include a two-level converter. That is, the power converter may convert input AC power into DC power having two levels of potential including an upper potential and a lower potential and output the DC power. In this case, using semiconductor modules similar to those of the second embodiment, a rectifier circuit including a bridge circuit using switching elements can be made to form a two-level converter circuit. Furthermore, when two inverter circuits are formed using the two modules 211, the two modules 212, and the two modules 213 (semiconductor modules) as in the power converter 310 according to the modified example, one of the two inverter circuits may be used as a converter circuit by changing the connection of the terminals 210c (see FIG. 16) on the output side of the modules 211 to 213. That is, one set of modules 211 to 213 may be used as a converter circuit that converts input AC power into DC power, and the other set of modules 211 to 213 may be used as an inverter circuit that converts the DC power output from one set of modules 211 to 213 into AC power and outputs the AC power. Alternatively, a pair of converter circuits connected in parallel to each other may be formed using the two modules 211, the two modules 212, and the two modules 213.

As shown above, the two modules 211, the two modules 212, and the two modules 213 arranged on the common cooling body 320, the capacitor 230, the conductors 241 and 242, and the conductors 351 and 352 are common components, and the connection destination of the terminal 210c of each of the modules 211 to 213 is changed such that a plurality of circuit configurations can be achieved.

While the conductors 241 and 242 (capacitor-side conductors) and the conductors 251 and 252 (module-side conductors) are connected to each other on the Y1 direction side on which the positive electrode-side terminals 210a among the terminals 210a to 210c (module-side terminals) of the modules 211 to 213 (semiconductor modules) are arranged in the aforementioned second embodiment, the present invention is not limited to this. In the present invention, the module-side conductors and the capacitor-side conductors may alternatively be connected to each other at the end in the direction (X direction) in which the semiconductor modules are aligned.

Furthermore, the modules 211 to 213 (semiconductor modules) may alternatively be aligned along the direction (Y direction) in which the terminals 210a to 210c are aligned instead of the X direction. In this case, a multi-parallel (two-or-more-parallel) power conversion circuit may be formed by aligning a plurality of modules 211, a plurality of modules 212, and a plurality of modules 213 along the Y direction. Also, in this case, the capacitor 230 may be two capacitors connected in parallel to each other, and the capacitor-side conductors and the module-side conductors may be connected to each other at both ends (Y1-direction and Y2-direction ends) in the Y direction in which the modules 211 to 213 are aligned. The capacitors 230 connected in parallel to each other are aligned along the Y direction, which is the same as the direction in which the modules 211 to 213 are aligned, and the capacitor-side conductors and the module-side conductors are connected to each other at both outer sides (the Y1 direction side and the Y2 direction side) in the Y direction such that an increase in the inductance of the power converter 310 can be reduced or prevented.

While the switching elements Q1 to Q4 included in the modules 11 to 13 (semiconductor modules) are MOSFETs in the aforementioned first embodiment, the present invention is not limited to this. In the present invention, the switching elements included in the semiconductor modules may alternatively be insulated gate bipolar transistors (IGBTs). In this case, a diode element is connected antiparallel to each of the IGBTs. The switching elements included in the modules 211 to 213 of the second embodiment may similarly be IGBTs.

While the conductor 40, 241, or 242 (capacitor-side conductor) is connected to the conductor 50, 251, or 252 (module-side conductor) on the end side of the terminal surface 33 or 233 (capacitor-side terminal surface) of the capacitor 31, 32, or 230 in each of the aforementioned first and second embodiments, the present invention is not limited to this. In the present invention, the capacitor-side conductor may alternatively be connected to the module-side conductor on the inner side (central portion) of the capacitor-side terminal surface.

While the conductor 40 (capacitor-side conductor) and the conductor 50 (module-side conductor) are connected to each other via the relay conductor 60 in the aforementioned first embodiment, the present invention is not limited to this. In the present invention, the capacitor-side conductor and the module-side conductor may alternatively be directly connected to each other without using the relay conductor. In addition, while the conductors 241 and 242 (capacitor-side conductors) are directly connected to the conductors 251 and 252 (module-side conductors) in the aforementioned second embodiment, even in the two-level circuit configuration, the module-side conductor and the capacitor-side conductor may alternatively be connected to each other via a relay conductor as in the first embodiment.

While the relay conductor 60 includes the notched holes 63 in the aforementioned first embodiment, the present invention is not limited to this. In the present invention, the relay conductor may alternatively include elongated holes extending in the direction in which the capacitor-side terminal surface and the module-side terminal surface face each other, instead of the notched holes opening in the direction in which the capacitor-side terminal surface and the module-side terminal surface face each other.

While the conductor 40 (capacitor-side conductor) on the capacitors 31 and 32 side includes the bent mounts 44 (capacitor-side mounts) in the aforementioned first embodiment, the present invention is not limited to this. In the present invention, the conductor 50 (module-side conductor) on the modules 11 to 13 (semiconductor modules) side may alternatively include a module-side bent portion.

While the terminals 13c (AC terminals) to which or from which AC power is input or output are arranged at the ends of the aligned modules 11 to 13 (semiconductor modules) in the aforementioned first embodiment, the present invention is not restricted to this. In the present invention, the AC terminals may alternatively be arranged in central portions of the aligned semiconductor modules other than the ends.

While the conductor 50 (module-side conductor) is separated into the laminated conductor 50a (first laminated conductor) and the laminated conductor 50b (second laminated conductor), and the laminated conductor 50a and the laminated conductor 50b are laminated in the aforementioned first embodiment, the present invention is not restricted to this. In the present invention, the conductor 50 may alternatively be integrally formed as one laminated conductor.

While each of the module 11 (first module) and the module 12 (second module) includes one switching element Q1 or Q4, and the module 13 (third module) includes two switching elements Q2 and Q3 in the aforementioned first embodiment, the present invention is not restricted to this. In the present invention, each of the first module and the second module may alternatively include two switching elements connected in series to each other, and the third module may alternatively include two clamp diodes.

While on the terminal surfaces 33 (capacitor-side terminal surfaces) of the capacitors 31 and 32, the terminals having the same potential are arranged obliquely in a staggered manner in the aforementioned first embodiment, the present invention is not restricted to this. In the present invention, on the capacitors, the terminals having the same potential may alternatively be arranged side by side. Furthermore, the number of terminals of each capacitor may alternatively be plural other than four.

While the power converter 10 or 210 and the capacitors 31 and 32 or the capacitor 230 are mounted on the railroad vehicle 101 in each of the aforementioned first and second embodiments, the present invention is not restricted to this. For example, the power converter and the capacitor(s) may alternatively be mounted on a vehicle such as an electric vehicle instead of a railroad vehicle. Furthermore, the power converter and the capacitor(s) may alternatively supply power to a stationary electric motor (motor) instead of a vehicle, for example.

While each of the converters 10a and 10b of the power converter 10 has a two-parallel configuration, and each of the inverters 10c to 10e has a two-parallel configuration as well in the aforementioned first embodiment, the present invention is not restricted to this. For example, one power converter (one converter and one inverter) may alternatively be provided instead of being arranged in parallel. Furthermore, each power converter (converter and inverter) may alternatively have a multi-parallel (three-or-more-parallel) configuration. Moreover, the parallel numbers of the converter and the inverter may alternatively be different from each other.

What is claimed is:

1. A power conversion device comprising:
    a power converter including a semiconductor module having a switching element and configured to convert input power and output converted power; and
    a capacitor electrically connected to the semiconductor module of the power converter; wherein
    the semiconductor module includes a module-side terminal surface on which a module-side terminal of the semiconductor module is arranged; and
    the capacitor includes a capacitor-side terminal surface on which a capacitor-side terminal of the capacitor is arranged, the capacitor-side terminal surface extending along the module-side terminal surface of the semiconductor module.

2. The power conversion device according to claim 1, further comprising:
    a capacitor-side conductor connected to the capacitor-side terminal and arranged along the capacitor-side terminal surface; and
    a module-side conductor connected to the module-side terminal and arranged along the module-side terminal surface; wherein
    the capacitor-side conductor and the module-side conductor are connected to each other on an end side of the capacitor-side terminal surface in a direction along the capacitor-side terminal surface while the capacitor-side terminal surface and the module-side terminal surface face each other.

3. The power conversion device according to claim 2, further comprising:
    a relay conductor to connect the capacitor-side conductor and the module-side conductor to each other on the end side of the capacitor-side terminal surface in the direction along the capacitor-side terminal surface.

4. The power conversion device according to claim 3, wherein
    the capacitor-side conductor includes a capacitor-side mount bent in a direction along a surface of the capacitor adjacent to the capacitor-side terminal surface from the direction along the capacitor-side terminal surface;
    the relay conductor has an L-shape extending along the module-side terminal surface and along a direction facing the module-side terminal surface, and includes a relay conductor-side mount connected to the capacitor-side mount in a portion extending along the direction facing the module-side terminal surface; and
    the relay conductor-side mount includes a notched hole opening in a direction in which the capacitor-side terminal surface and the module-side terminal surface face each other.

5. The power conversion device according to claim 1, wherein
    the power converter includes at least one of a converter configured to convert input AC power into DC power or an inverter configured to convert input DC power into AC power and output the AC power;
    the semiconductor module includes a plurality of aligned semiconductor modules;
    the plurality of semiconductor modules includes an input/output module including an AC terminal to which an AC conductor to which or from which AC power is configured to input or output is connected;
    the input/output module is arranged at an end on one side in a direction in which the plurality of semiconductor modules is aligned; and
    the AC terminal is arranged on the one side in the input/output module.

6. The power conversion device according to claim 1, further comprising:
    a module-side conductor connected to the module-side terminal and arranged along the module-side terminal surface; wherein
    the power converter includes at least one of a three-level inverter to which three levels of potential including an upper potential, an intermediate potential, and a lower potential are configured to be input or a three-level converter from which three levels of potential including an upper potential, an intermediate potential, and a lower potential are configured to be output;
    the module-side conductor includes an upper conductor to which an upper potential is configured to be applied, an intermediate conductor to which an intermediate potential is configured to be applied, and a lower conductor to which a lower potential is configured to be applied; and
    the capacitor-side terminal surface of the capacitor faces the upper conductor, the intermediate conductor, and the lower conductor.

7. The power conversion device according to claim 6, wherein
    the semiconductor module includes:
        a first module including one switching element and one clamp diode and connected to the upper conductor and the intermediate conductor;
        a second module including one switching element and one clamp diode and connected to the intermediate conductor and the lower conductor; and
        a third module including two switching elements and connected to the first module and the second module;
    the module-side conductor includes a first connection conductor to connect the first module to the third module, and a second connection conductor to connect the second module to the third module;
    the upper conductor, the intermediate conductor, and the lower conductor are laminated while being insulated from each other to form a first laminated conductor; and
    the first connection conductor and the second connection conductor are laminated separately from the first laminated conductor while being insulated from each other to form a second laminated conductor.

8. The power conversion device according to claim 1, further comprising:
    a module-side conductor connected to the module-side terminal and arranged along the module-side terminal surface; wherein
    the power converter includes at least one of a two-level inverter to which two levels of potential including an upper potential and a lower potential are configured to be input or a two-level converter from which two levels of potential including an upper potential and a lower potential are configured to be output;

the module-side conductor includes an upper conductor to which the upper potential is configured to be applied and a lower conductor to which the lower potential is configured to be applied; and the capacitor-side terminal surface of the capacitor faces the upper conductor and the lower conductor.

9. The power conversion device according to claim 1, wherein the power converter and the capacitor are mounted on a railroad vehicle.

10. The power conversion device according to claim 1, wherein the capacitor-side terminal surface extends in parallel with the module-side terminal surface.

11. The power conversion device according to claim 1, further comprising a capacitor-side conductor connected to the capacitor-side terminal; and a module-side conductor connected to the module-side terminal, wherein the capacitor-side conductor is between the capacitor-side terminal surface and the module-side conductor, and the module-side conductor is between the module-side terminal surface and the capacitor-side conductor.

12. The power conversion device according to claim 1, wherein the power conversion device further comprises a cooling body on the other side of the module-side terminal surface, and the capacitor-side terminal surface faces towards the cooling body.

* * * * *